US008299848B2

(12) United States Patent
Sugaya et al.

(10) Patent No.: US 8,299,848 B2
(45) Date of Patent: Oct. 30, 2012

(54) MULTI-LAYERED SEMICONDUCTOR APPARATUS

(75) Inventors: Isao Sugaya, Tokyo (JP); Kazuya Okamoto, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/694,008

(22) Filed: Jan. 26, 2010

(65) Prior Publication Data
US 2010/0201432 A1    Aug. 12, 2010

Related U.S. Application Data

(63) Continuation of application No. PCT/JP2008/063442, filed on Jul. 25, 2008.

(30) Foreign Application Priority Data

Jul. 27, 2007  (JP) ................................. 2007-196767
Dec. 18, 2007  (JP) ................................. 2007-325604

(51) Int. Cl.
 *H01L 25/00*    (2006.01)
(52) U.S. Cl. ...................................... 327/565
(58) Field of Classification Search .................. 327/564, 327/565, 566
See application file for complete search history.

(56) References Cited

U.S. PATENT DOCUMENTS

| 6,255,899 | B1 * | 7/2001 | Bertin et al. | 327/564 |
| 6,812,557 | B2 * | 11/2004 | Matsuo et al. | 257/686 |
| 6,917,100 | B2 * | 7/2005 | Chennupati | 257/686 |
| 7,115,967 | B2 | 10/2006 | Cleeves | |
| 7,297,574 | B2 * | 11/2007 | Thomas et al. | 438/109 |
| 7,327,590 | B2 * | 2/2008 | Matsui et al. | 365/51 |
| 7,521,785 | B2 * | 4/2009 | Damberg et al. | 257/686 |
| 2006/0267188 | A1 | 11/2006 | Ishino et al. | |

FOREIGN PATENT DOCUMENTS

| JP | 2002-009228 | 1/2002 |
| JP | 2004-158892 | 6/2004 |
| JP | 2006-032379 | 2/2006 |
| JP | 2006-295059 | 10/2006 |
| JP | 2006-319243 | 11/2006 |

OTHER PUBLICATIONS

English-language International Search Report, from the Japanese Patent Office in corresponding International Application No. PCT/JP2008/063442, mailed Oct. 14, 2008.
Written Opinion of the International Searching Authority issued in corresponding International Application No. PCT/JP2008/063442, mailed Mar. 4, 2010.

(Continued)

*Primary Examiner* — Jeffrey Zweizig
(74) *Attorney, Agent, or Firm* — Finnegan, Henderson, Farabow, Garrett & Dunner, L.L.P.

(57) ABSTRACT

Provided is a multi-layered semiconductor apparatus with improved heat diffusion and improved heat release. The multi-layered semiconductor apparatus (100) includes a plurality of layered semiconductor chips (20-1, 20-2) that each include at least one circuit region, and the circuit regions are arranged such that heat generated by the circuit regions as a result of the circuit regions being driven is spread out. The multi-layered semiconductor apparatus (100) further comprises a heat releasing section (50) that releases the heat generated by the circuit regions, and the circuit regions are arranged such that there is less thermal resistance between the heat releasing section and circuit regions that generate a greater amount of heat per unit area.

69 Claims, 19 Drawing Sheets

OTHER PUBLICATIONS

Notification of Transmittal of Copies of Translation of the International Preliminary Report on Patentability, in corresponding International application No. PCT/JP2008/063442, mailed Mar. 4, 2010.

Akita Denshi Systems:KK; "Layered Semiconductor Apparatus and Method of Manufacturing the Same", English-language Translation of Japanese Patent Application Publication No. 2006-32379, Feb. 2, 2006.

Denso Corp; "Semiconductor Device and Method of Manufacturing the Same", English-language Translation of Japanese Patent Application Publication No. 2006-295059, Oct. 26, 2006.

Hitachi Ltd et al.; "Memory Module", English-language Translation of Japanese Patent Application Publication No. 2004-158892, Jun. 3, 2006.

Seiko Epson Corp; "Semiconductor Device", English-language Translation of Japanese Patent Application Publication No. 2002-009228, Jan. 11, 2002.

* cited by examiner

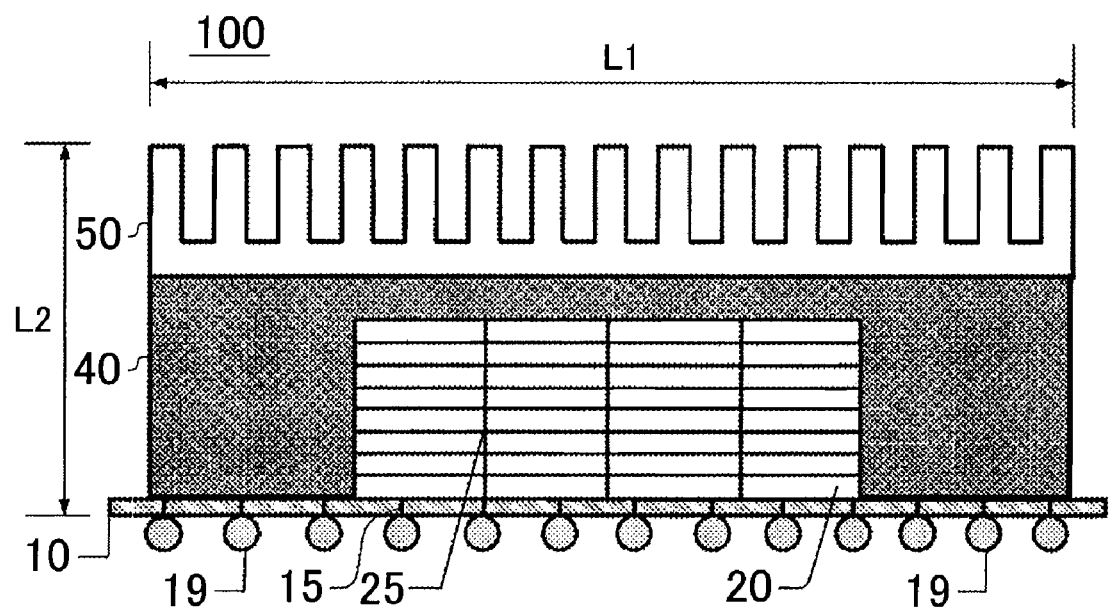
F I G . 1A
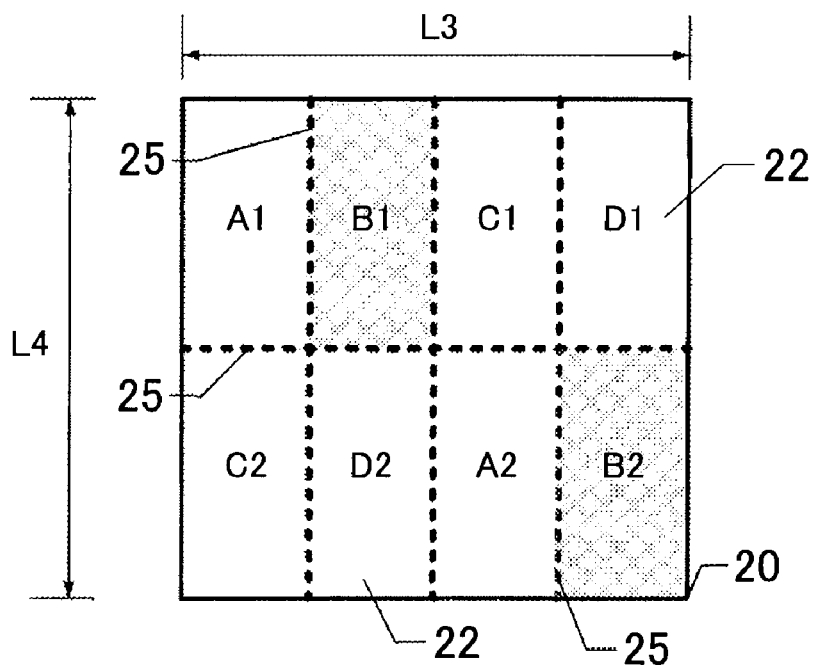
F I G . 1B

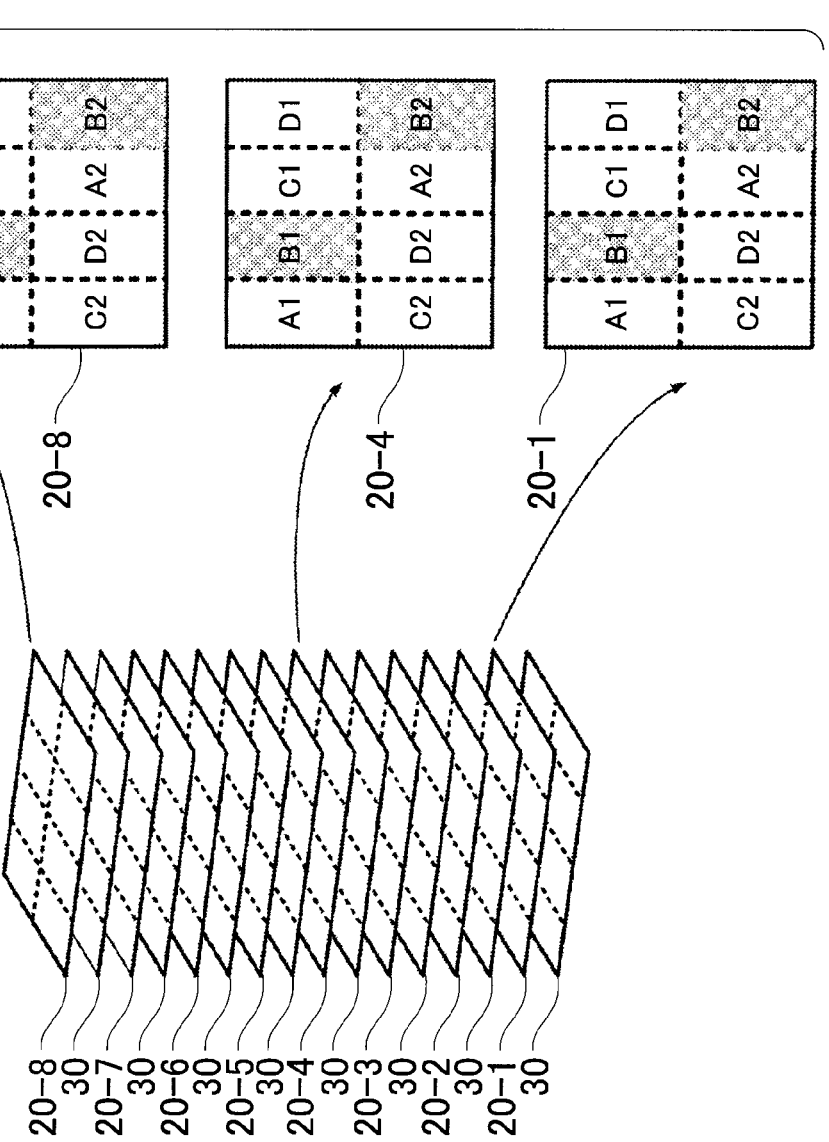

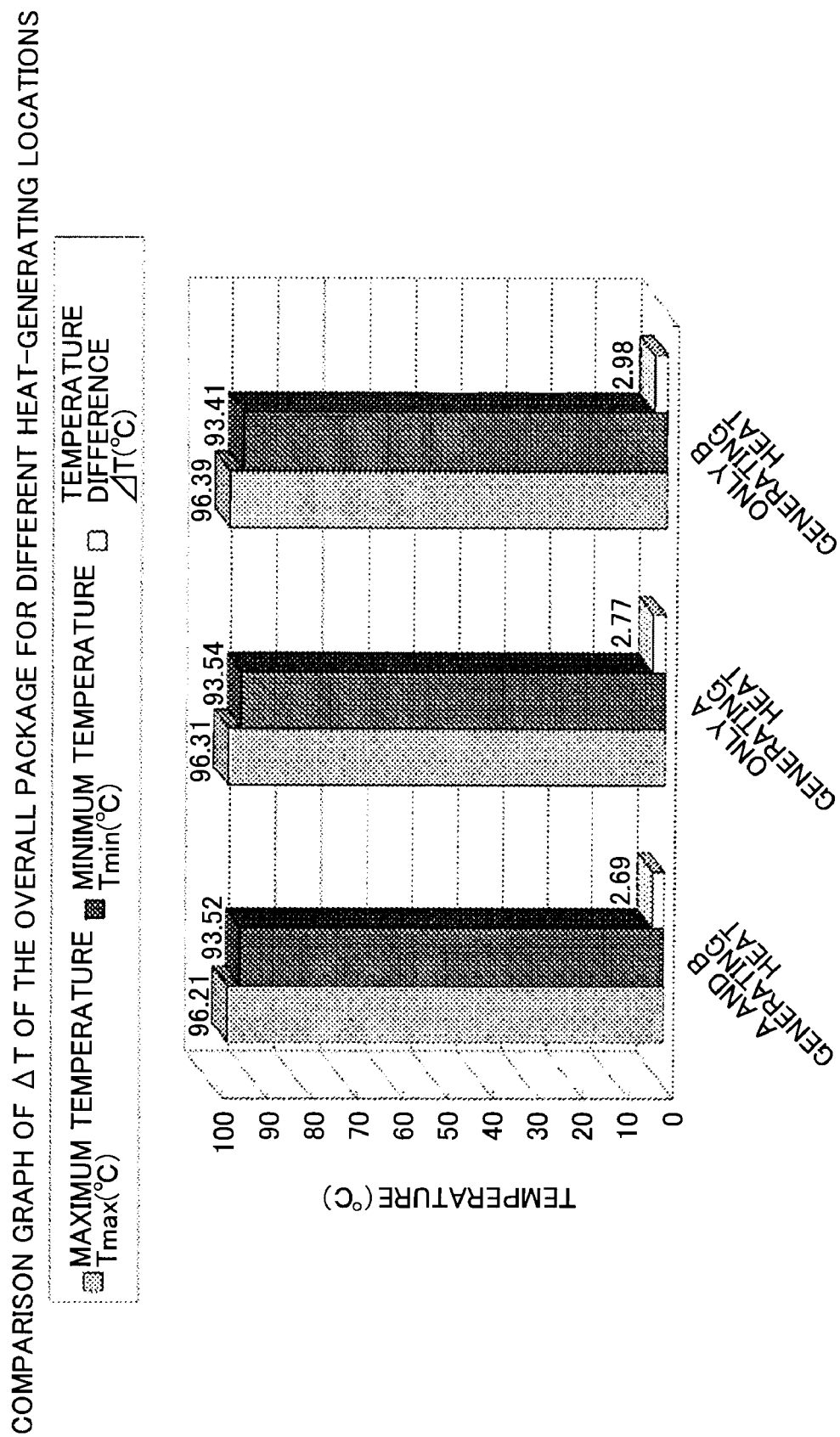
F I G. 5B

SHARED BORDER AREA S = b × t

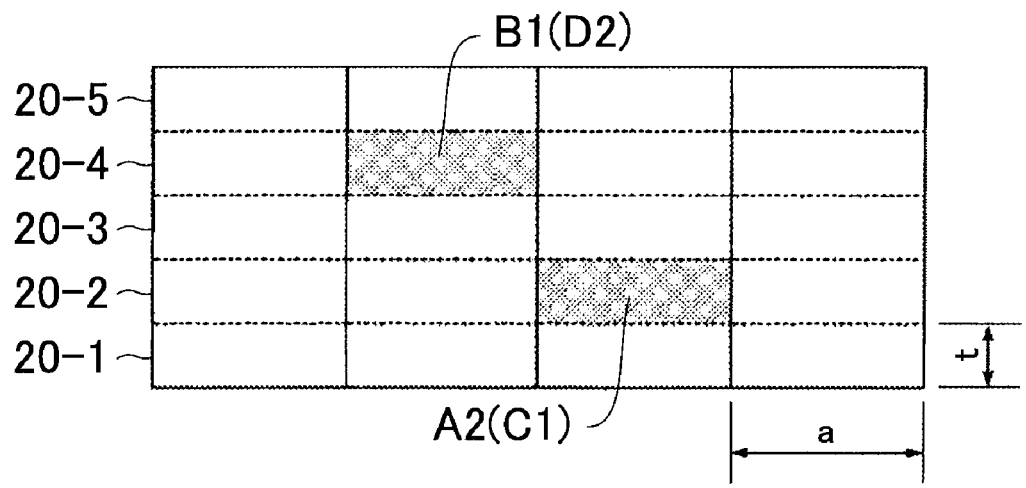
F I G. 11A
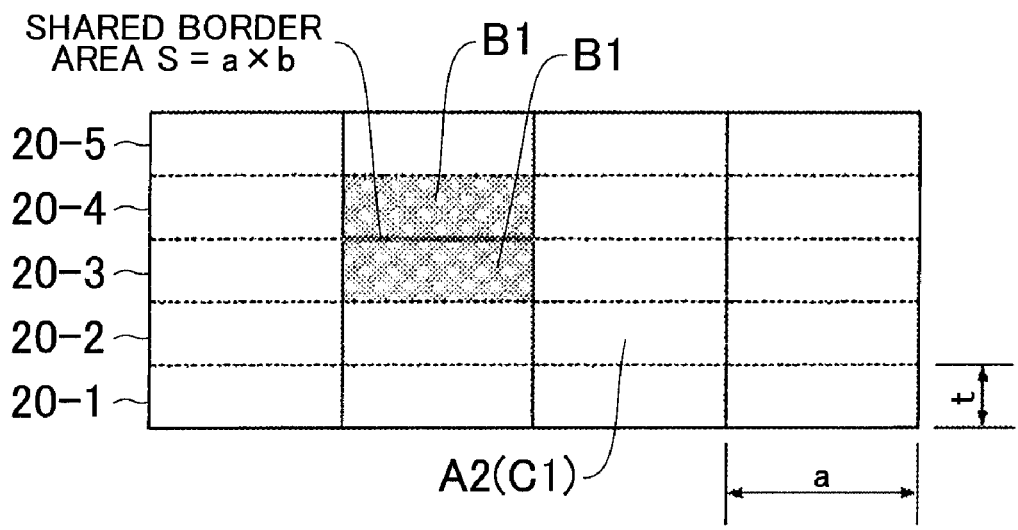
F I G. 11B

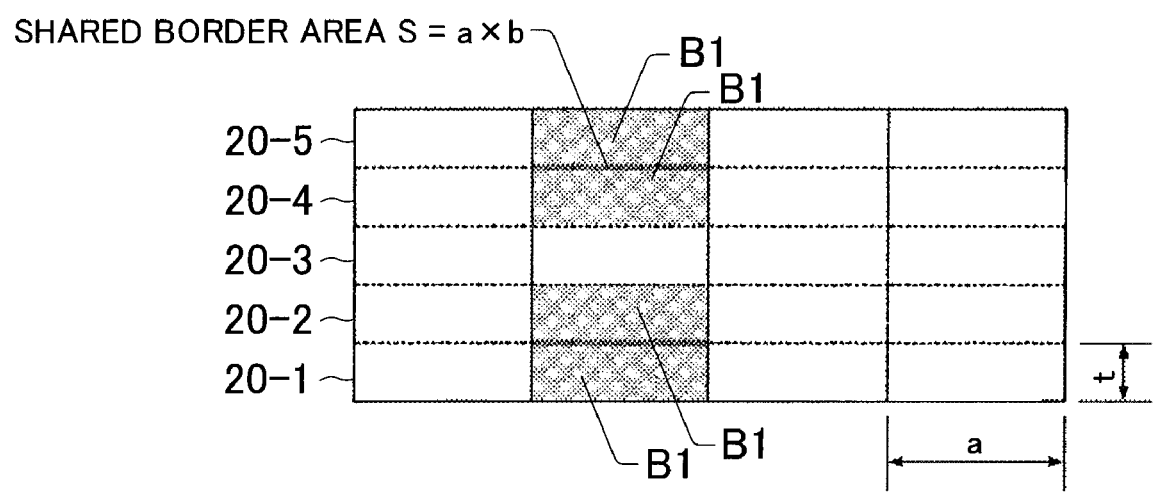
F I G . 13

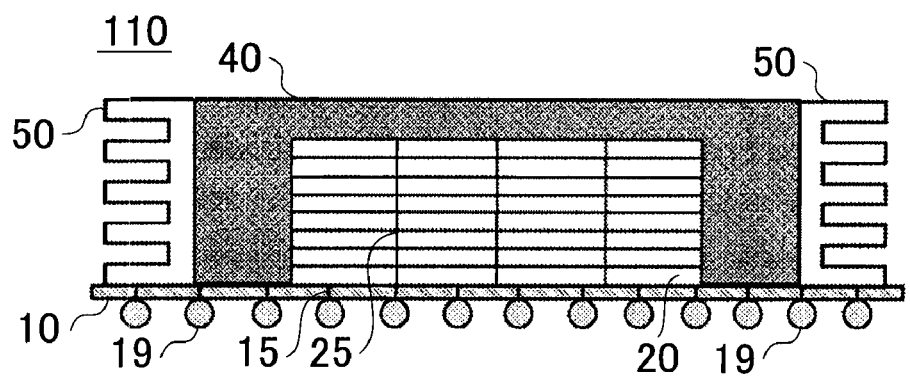
F I G. 18A
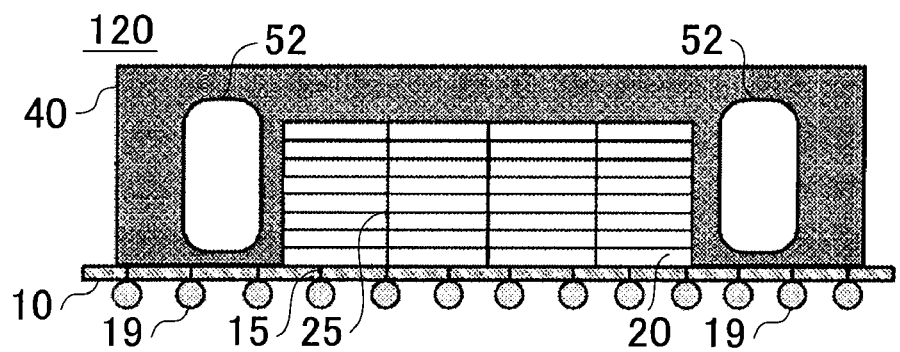
F I G. 18B
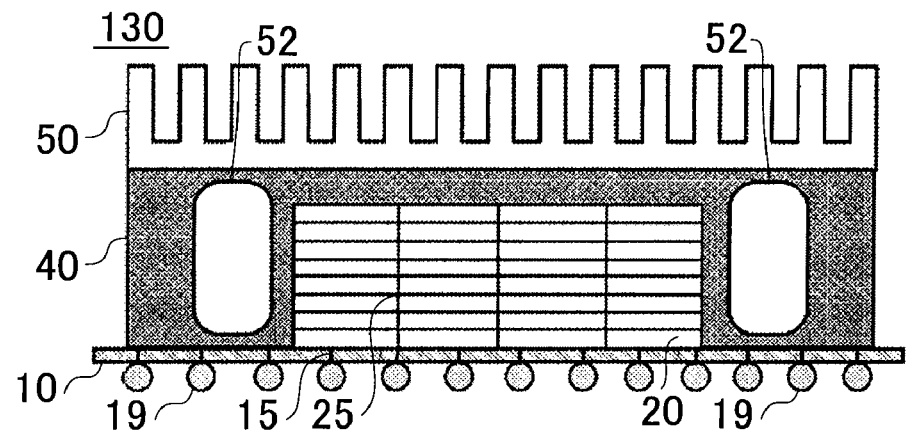
F I G. 18C
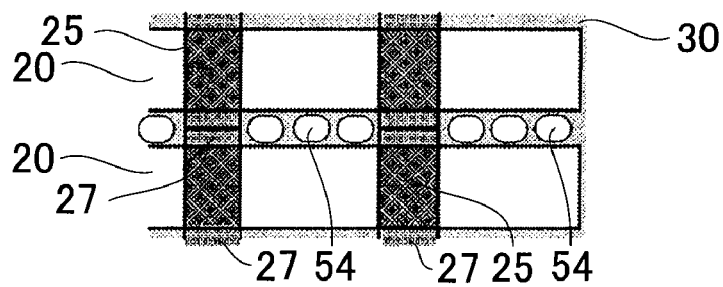
F I G. 18D

MULTI-LAYERED SEMICONDUCTOR APPARATUS

CROSS REFERENCE TO RELATED APPLICATION

This is a continuation application of PCT/JP2008/063442 filed on Jul. 25, 2008 which claims priority from Japanese Patent Applications No. 2007-196767 filed on Jul. 27, 2007, and No. 2007-325604 filed on Dec. 18, 2007, the contents of which are incorporated herein by reference.

BACKGROUND

1. Technical Field

The present invention relates to a multi-layered semiconductor apparatus formed by layered semiconductor elements.

2. Related Art

In recent years, electronic devices such as mobile phones and personal computers have become smaller, thinner, and more light-weight, and this increases the demand for smaller electronic components that have high performance or multiple functions. Along with this trend, there is a desire for smaller semiconductor apparatuses that require less area for installation and have high performance or multiple functions. In memory ICs, the demand for larger memory capacity, lighter weight, and lower cost is particularly high, and therefore various package configurations and implementation configurations are being considered for memory ICs.

For example, U.S. Pat. No. 7,115,967 aims to increase the capacity of a memory IC loaded on a package, and discloses semiconductor package in which chips having memory functions are three-dimensionally layered.

As shown by Japanese Patent Application Publication No. 2006-032379, the demand for semiconductor apparatus packages that have a memory function and a logic function in a single package is currently increasing. One technique for achieving the memory function and the logic function in a single package involves layering packages, which are implemented in flip chips formed on thin circuit boards, onto a base board.

Since packages in which the memory ICs and logic ICs are implemented independently are layered in this configuration, a change in the request function between users can be easily adapted to by changing the type of layered memory ICs and logic ICs, and this has the advantage of shortening the development time for the semiconductor package. Therefore, the future development of semiconductor packets including memory functions and logic functions is expected to involve the development of configurations in which ICs having memory functions and ICs having logic functions are layered.

However, the multi-layered semiconductor apparatus described above has the following problems. A package that includes many memory IC layers to achieve a large memory capacity has few areas from which the heat generated by the memory circuits can escape. Furthermore, in the case of a semiconductor package including a memory function and a logic function and having a three-dimensional layered configuration, the semiconductor elements reach high temperatures due to the heat generated when the logic IC operates, and this heat is of an order greater than the heat generated by the memory ICs.

If the semiconductor package cannot release enough heat, a delay occurs in the computational processing, and this causes operational errors in the semiconductor package. Even if a uniform temperature increase is achieved due to differences in the thermal expansion of materials such as silicon (Si) and an insulator used to form the semiconductor package, the semiconductor package experiences thermal stress, and even more thermal stress may be added by temperature irregularities in the heat-generating regions, which would cause thermal deformation or damage the IC elements in the package through thermal stress.

In order to observe the temperature of the semiconductor package, a technique commonly used is controlling rotation of a heat release fan based on temperature information from a thermal sensor disposed near the semiconductor package. With this technique, precise thermal control cannot be achieved since the temperature distribution within the three-dimensional layered structure cannot be observed. Accordingly, temperature control is becoming extremely important for three-dimensional layered semiconductor packages to solve the above problems relating to heat.

Therefore it is an object of an aspect of the innovations herein to provide a multi-layered semiconductor apparatus in which semiconductor elements are layered in three-dimensions, which can increase the dispersion of heat and the efficiency of heat release.

SUMMARY

Therefore, it is an object of an aspect of the innovations herein to provide a multi-layered semiconductor apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a multi-layered semiconductor apparatus including a plurality of layered semiconductor chips that each include at least one circuit region, wherein the circuit regions are arranged such that heat generated by the circuit regions as a result of the circuit regions being driven is spread out.

With this configuration, an increase in temperature due to heat generation within the multi-layered semiconductor apparatus is restricted and the fluctuations in the thermal distribution are also restricted, and so operational errors, thermal deformation of the semiconductor apparatus, and damage to the elements thereof are prevented.

According to a second aspect related to the innovations herein, provided is a multi-layered semiconductor apparatus including a plurality of layered semiconductor chips that each include at least one circuit region, wherein at least one of the semiconductor chips includes a plurality of circuit regions that are driven during overlapping time periods, and the circuit regions that are driven during overlapping time periods are arranged to be separated from each other.

With this configuration as well, an increase in temperature due to heat generation within the multi-layered semiconductor apparatus is restricted and the fluctuations in the thermal distribution are also restricted, and so operational errors, thermal deformation of the semiconductor apparatus, and damage to the elements thereof are prevented.

According to a third aspect related to the innovations herein, provided is a multi-layered semiconductor apparatus including a plurality of layered semiconductor chips that each include at least one circuit region, wherein in at least one of the semiconductor chips, a plurality of circuit regions that are driven during overlapping time periods are arranged in contact with each other, and the circuit regions that are driven during overlapping time periods are arranged such that at least portions thereof are misaligned along a shared border therebetween.

With this configuration as well, an increase in temperature due to heat generation within the multi-layered semiconductor apparatus is restricted and the fluctuations in the thermal distribution are also restricted, and so operational errors, thermal deformation of the semiconductor apparatus, and damage to the elements thereof are prevented.

According to a fourth aspect related to the innovations herein, provided is a multi-layered semiconductor apparatus including a plurality of layered semiconductor chips that each include at least one circuit region, wherein a first semiconductor chip, which is one of the plurality of semiconductor chips, includes a first circuit region that is driven, a second semiconductor chip, which is one of the plurality of semiconductor chips and is arranged contacting the first semiconductor chip, includes a second circuit region that is driven during a time period that overlaps with a time period during which the first circuit region is driven, and the first circuit region and the second circuit region are arranged to be separated from each other.

With this configuration as well, an increase in temperature due to heat generation within the multi-layered semiconductor apparatus is restricted and the fluctuations in the thermal distribution are also restricted, and so operational errors, thermal deformation of the semiconductor apparatus, and damage to the elements thereof are prevented.

According to a fifth aspect related to the innovations herein, provided is a multi-layered semiconductor apparatus including a plurality of layered semiconductor chips that each include at least one circuit region, wherein a first semiconductor chip, which is one of the plurality of semiconductor chips, includes a first circuit region that is driven, a second semiconductor chip, which is one of the plurality of semiconductor chips and is arranged contacting the first semiconductor chip, includes a second circuit region that is driven during a time period that overlaps with a time period during which the first circuit region is driven, and the first circuit region and the second circuit region are arranged such that at least portions thereof are misaligned along a shared border therebetween.

With this configuration as well, an increase in temperature due to heat generation within the multi-layered semiconductor apparatus is restricted and the fluctuations in the thermal distribution are also restricted, and so operational errors, thermal deformation of the semiconductor apparatus, and damage to the elements thereof are prevented.

According to a sixth aspect related to the innovations herein, provided is a multi-layered semiconductor apparatus including a plurality of layered semiconductor chips that each include at least one circuit region, wherein a first semiconductor chip, which is one of the plurality of semiconductor chips, includes a first circuit region that is driven, a second semiconductor chip, which is one of the plurality of semiconductor chips, includes a second circuit region that overlaps with the first circuit region in a direction of the chip layering and that is driven during a time period that overlaps with a time period during which the first circuit region is driven, and the multi-layered semiconductor apparatus comprises a non-heat-generating region arranged between the first circuit region and the second circuit region.

With this configuration as well, an increase in temperature due to heat generation within the multi-layered semiconductor apparatus is restricted and the fluctuations in the thermal distribution are also restricted, and so operational errors, thermal deformation of the semiconductor apparatus, and damage to the elements thereof are prevented.

According to a seventh aspect related to the innovations herein, provided is a multi-layered semiconductor apparatus including a plurality of layered semiconductor chips that each include at least one circuit region, comprising a control circuit that controls driving of the circuit regions such that heat generated by the circuit regions as a result of the circuit regions being driven is spread out.

With this configuration, the thermal distribution within the heat-generating layered structure of the multi-layered semiconductor apparatus is lowered by the control circuit spreading out the heat that is generated by the circuit regions being driven. As a result, operational errors, thermal deformation of the semiconductor apparatus, and damage to the elements thereof are prevented.

According to an eighth aspect related to the innovations herein, provided is a control method of a multi-layered semiconductor apparatus including a plurality of layered semiconductor chips that each include at least one circuit region, comprising controlling driving of the circuit regions such that heat generated by the circuit regions as a result of the circuit regions being driven is spread out.

This method for controlling a multi-layered semiconductor apparatus can decrease the thermal distribution within the heat-generating multi-layered semiconductor apparatus, and so operational errors, thermal deformation of the semiconductor apparatus, and damage to the elements thereof are prevented.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 1A is a cross-sectional view of a semiconductor apparatus 100 formed of multiple layers of chip 20, according to a first embodiment of the present invention.

FIG. 1B is a planar view of one chip 20 as seen from the circuit region 22 side.

FIG. 3A is a schematic view of the chip 20 and underfill 30 in each layer of the semiconductor apparatus 100 according to the first embodiment.

FIG. 3B shows a state in which, from among the eight circuit regions 22, the circuit regions B1 and B2 generate heat.

FIG. 5A-2 is a schematic view of heat generated in each chip layer.

FIG. 5A-3 is a schematic view of heat generated in each chip layer.

FIG. 5B shows thermal analysis results for each chip layer.

FIG. 11A is a cross-sectional view of the fifth-layer semiconductor chip, and shows positions of two circuit regions that generate heat at the same time.

FIG. 11B is a cross-sectional view of the fifth-layer semiconductor chip, and shows positions of two circuit regions that generate heat at the same time.

FIG. 13 is a cross-sectional view of the fifth-layer semiconductor chip, and shows positions of two circuit regions that generate heat at the same time.

FIG. 18A shows the semiconductor apparatus 100 in which the arrangement of the heat releasing component 50 has been changed.

FIG. 18B shows the semiconductor apparatus 100 provided with cooling pipes 52.

FIG. 18C shows the semiconductor apparatus 100 provided with cooling pipes 52.

FIG. 18D shows the semiconductor apparatus 100 provided with microdrains 54.

DESCRIPTION OF EXEMPLARY EMBODIMENTS

Figure 2A:
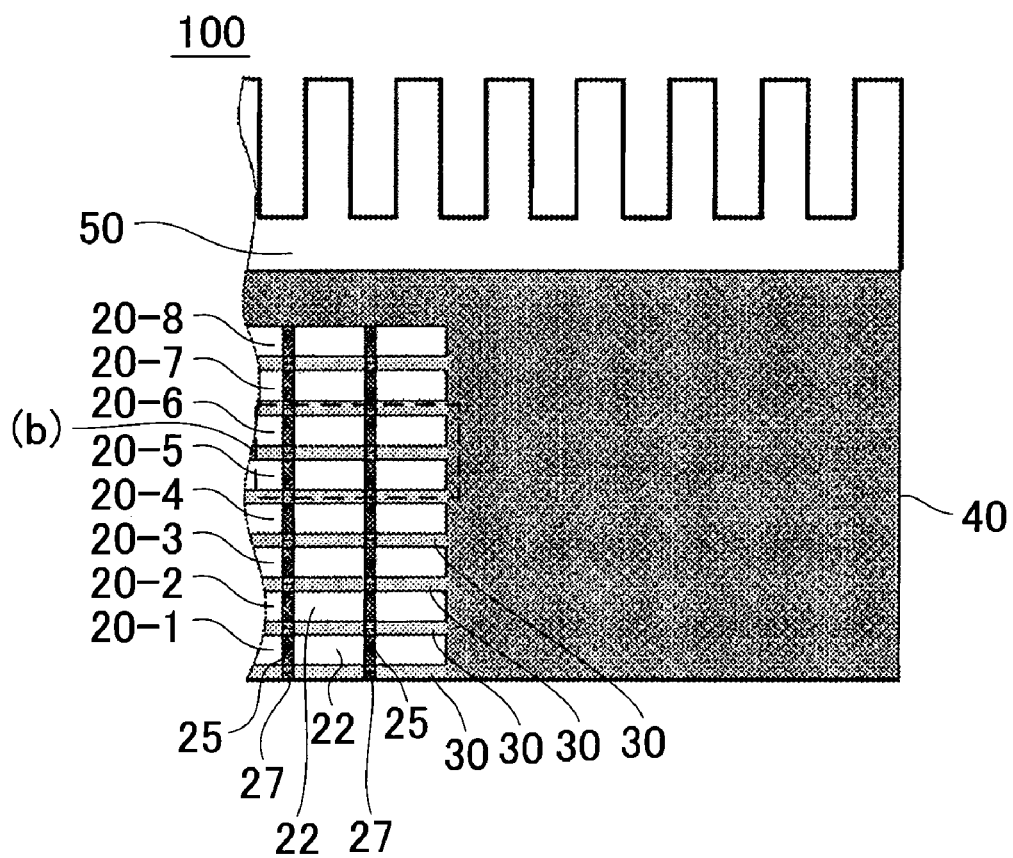
FIG. 2A is a partial enlarged view of the semiconductor apparatus 100 shown in FIG. 1A.

Hereinafter, some embodiments of the present invention will be described. The embodiments do not limit the invention according to the claims, and all the combinations of the features described in the embodiments are not necessarily essential to means provided by aspects of the invention.

<<Basic Configuration of the Semiconductor Apparatus>>

FIG. 1A is a cross-sectional view of a semiconductor apparatus 100 formed of multiple layers of chip 20, according to a first embodiment of the present invention.

As shown in FIG. 1A, the semiconductor apparatus 100 includes eight layers of chips 20 that each have a plurality of circuit regions 22 arranged in a two-dimensional matrix. The semiconductor apparatus 100 may be a square in which the length of each side L1 is 12 mm, and may have a thickness L2 of approximately 0.66 mm. The semiconductor apparatus 100 includes an interposer 10, which is a relay board forming connection wiring on the bottom of the semiconductor apparatus 100. The eight layers of chip 20 are formed on the interposer 10.

The interposer 10 includes a plurality of through-electrodes 15. The arrangement and pitch of a plurality of second through-electrodes 15 of the interposer 10 is wider than the arrangement and pitch of the through-electrodes 25 of the layered structure. A plurality of solder balls 19 that are electrically connected to the second through-electrodes 15 are connected to the bottom surface of the interposer 10. In the above embodiment, the pitch of the wiring is changed as an example of the interposer 10 changing the wiring dimensions between the chips and the external board, but as another example, the wiring length, width, or the like may be changed instead.

The eight layers of chips 20-1 to 20-8 formed on the interposer 10 are sealed by a sealing resin 40, which is an insulating material. The interposer 10 can be made of glass epoxy resin, polyimide resin, silicon resin, or the like. The sealing resin 40 is a thermosetting resin with a high concentration of filler, in order to ensure high reliability. For example, a thermoplastic epoxy resin with a high concentration of filler may be used as the sealing resin 40. Instead of the sealing resin 40, an insulating ceramic may be used for the sealing. Here, the interposer 10 is desirably made of a material having higher thermal conductivity than the sealing resin 40. As a result, the heat is efficiently released to the outside.

The semiconductor apparatus 100 of the first embodiment includes a heat releasing component 50 that releases heat on the top surface of the sealing resin 40. The heat releasing component 50 is made of aluminum and includes a plurality of fins, for example, and is used to increase the area that contacts the ambient atmosphere.

FIG. 1B is a planar view of one chip 20 as seen from the circuit region 22 side. As shown in FIG. 1B, the one chip 20 is a square with side lengths L3 and L4 of 10 mm and a thickness of 30 to 80 μm. In the present embodiment, one chip 20 has eight circuit regions 22. Each circuit region 22 is a three-dimensional region having a substantially rectangular planar shape. Each circuit region 22 includes a plurality of through-electrodes 25 and a plurality of bumps 27, shown in FIGS. 2A and 2B. The bumps 27 are provided on the surfaces of the through-electrodes 25 on a first side.

In FIG. 1B, the eight circuit regions 22 are labeled as A1, A2, B1, B2, C1, C2, D1, and D2. This indicates that the circuit region A1 and the circuit region A2 have substantially the same functions, while the circuit regions A1 and A2 have different functions from the circuit regions B1 and B2. For example, the circuit regions A1 and A2 may be memory circuit regions, while the circuit regions B1 and B2 may be logic circuit regions. This is merely one example, and it is possible for all of the plurality of circuit regions 22 on one chip 20 to be memory circuit regions and for all of the plurality of circuit regions 22 on another chip 20 to be logic circuit regions. A through-electrode 25 is formed within each circuit region 22. In the present embodiment, one chip 20 includes eight circuit regions A1, A2, B1, B2, B3, C1, C2, D1, and D2, but one chip 20 need only include at least one circuit region.

Figure 2B:
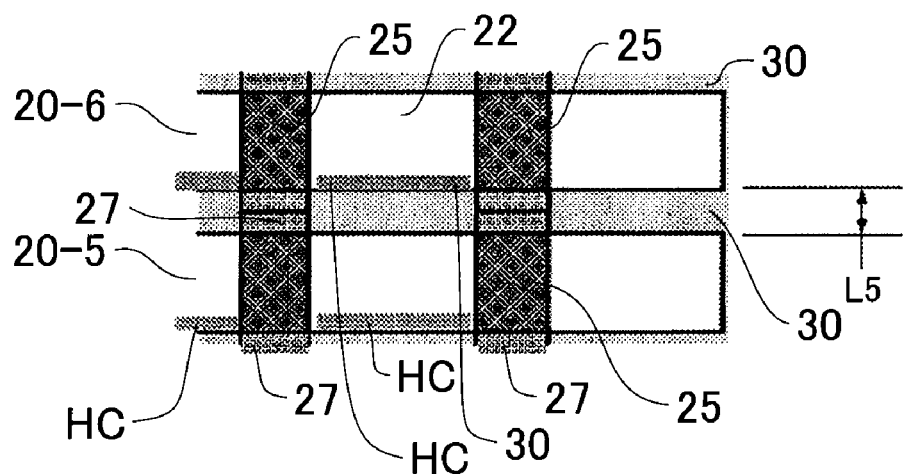
FIG. 2B is a partial enlarged view of a portion of FIG. 2A.

FIG. 2A is a partial enlarged view of the semiconductor apparatus 100 shown in FIG. 1A, and FIG. 2B is a partial enlarged view of a portion of FIG. 2A. As shown in FIGS. 2A and 2B, a second-layer chip 20-2 having a plurality of circuit regions 22 arranged in a two-dimensional matrix is layered on top of a first-layer chip 20-1 having a plurality of circuit regions 22 arranged in a two-dimensional matrix. The through-electrodes 25 of the second-layer chip 20-2 and the through-electrodes 25 of the first-layer chip 20-1 are arranged at corresponding horizontal positions, and so the through-electrodes 25 of these chips 20 are electrically connected to each other via the bumps 27. In the present embodiment, the circuit regions 22 of the first-layer chip 20-1 and the circuit regions 22 of the second-layer chip 20-2 completely overlap with respect to their horizontal positions.

The first-layer chip 20-1 and the second layer chip 20-2 refer to circuit patterns having any number of layers formed of silicon (Si) material with an exposure apparatus. The through-electrodes 25 may be made of various conductive materials such as Au, Ag, Cu, Ni, W, Sn, Ag, Poly-Si, and the like. The bumps 27 may be made of various conductive materials such as Sn/Pn, Au, Cu, Cu+SnAg, and the like. In the present embodiment, Poly-Si is used for the through-electrodes 25 and Cu is used for the bumps 27. The cross-sections of the through-electrodes 25 and the bumps 27 are each approximately 20 μm by 20 μm.

In the present embodiment, the conduction between the first-layer chip 20-1 and the second-layer chip 20-2, that is, the electrical connection between the circuit regions 22 in the respective layers, can be realized using any of a variety of known methods. For example, the connections between the chips may be achieved using pressing and heating. As another example, the connections between the chips may be achieved using pressing at a normal temperature. The connections between the chips may be achieved using only heating. The connections between the chips may be achieved by applying ultrasonic waves. The connections between the chips may be achieved using a combination of pressing, heating, and ultrasonic waves. As a specific example, these connections may be achieved using the wafer alignment method disclosed in Japanese Patent Application Publication No. 2005-251972, which was filed by the applicant.

As shown in FIGS. 2A and 2B, an underfill 30 is provided between the first-layer chip 20-1 and the second-layer chip 20-2. The underfill 30 provided here contacts the side surfaces of the chips 20. The underfill 30 is an insulating resin that exhibits the properties of a liquid with low viscosity. The underfill 30 having the properties of a liquid fills the gap between the first-layer chip 20-1 and the second-layer chip 20-2 up to the center of each chip 20, via a so-called capillary effect. Accordingly, the gap between the first-layer chip 20-1 and the second-layer chip 20-2 is completely filled by the underfill 30 having the properties of a liquid. The underfill 30 can be supplied using a needle dispenser.

If the underfill 30 is a thermosetting resin, the underfill 30 can be hardened by applying heat thereto. Thermosetting epoxy resin is one example of a common thermosetting resin. With the connection between the first-layer chip 20-1 and the second-layer chip 20-2 by pressing and heating the Cu bumps, a large force is applied to the chips 20 when the impact of a load weight is added, and the first-layer chip 20-1 and the second-layer chip 20-2 are even more firmly connected when the underfill 30 hardens. The gap L5 between the first-layer chip 20-1 and the second-layer chip 20-2 is desirably from 10 μm to 30 μm.

The above description focuses mainly on the first-layer chip 20-1 and the second-layer chip 20-2, but the semiconductor apparatus 100 of the first embodiment is formed by layering eight chips 20 from the first-layer chip 20-1 to the eighth-layer chip 20-8. Although the chips from the third-layer chip 20-3 to the eighth-layer chip 20-8 are not specifically described, these chips are connected in the same manner as the first-layer chip 20-1 and the second-layer chip 20-2.

When the connected circuit regions 22 are accessed by a control apparatus, the circuit regions 22 generate heat. In particular, if the circuit regions 22 are MPUs, high-speed communication devices, or the like, the circuit regions 22 are prone to generating heat during the frequent operation of switching signals.

As shown in FIG. 2B, the surface of each circuit region 22, that is, the surface on which the pattern is formed, is a heat generating region HC.

Each chip 20 has eight circuit regions 22 formed thereon. These circuit regions 22 are connected to each other within a single chip 20, and the circuit regions 22 of the first-layer chip 20-1 are connected to the circuit regions 22 of the eighth-layer chip 20-8.

<Heat Generation by the Semiconductor Apparatus>

FIG. 3A is a schematic view of the chip 20 and underfill 30 in each layer of the semiconductor apparatus 100 according to the first embodiment. FIG. 3B shows a state in which, from among the eight circuit regions 22, the circuit regions B1 and B2 generate heat. For example, the bottom region in FIG. 3B shows a state in which the circuit regions B1 and B2 in the first-layer chip 20-1 are generating heat, the middle region in FIG. 3B shows a state in which the circuit regions B1 and B2 in the fourth-layer chip 20-4 are generating heat, and the top region in FIG. 3B shows a state in which the circuit regions B1 and B2 in the eighth-layer chip 20-8 are generating heat. The following describes results of a thermal analysis performed when the eight layers of chips 20 having eight circuit regions 22 generate heat.

<<Maximum Temperature and Maximum Temperature Difference of Each Chip Layer>>

Figure 4B:
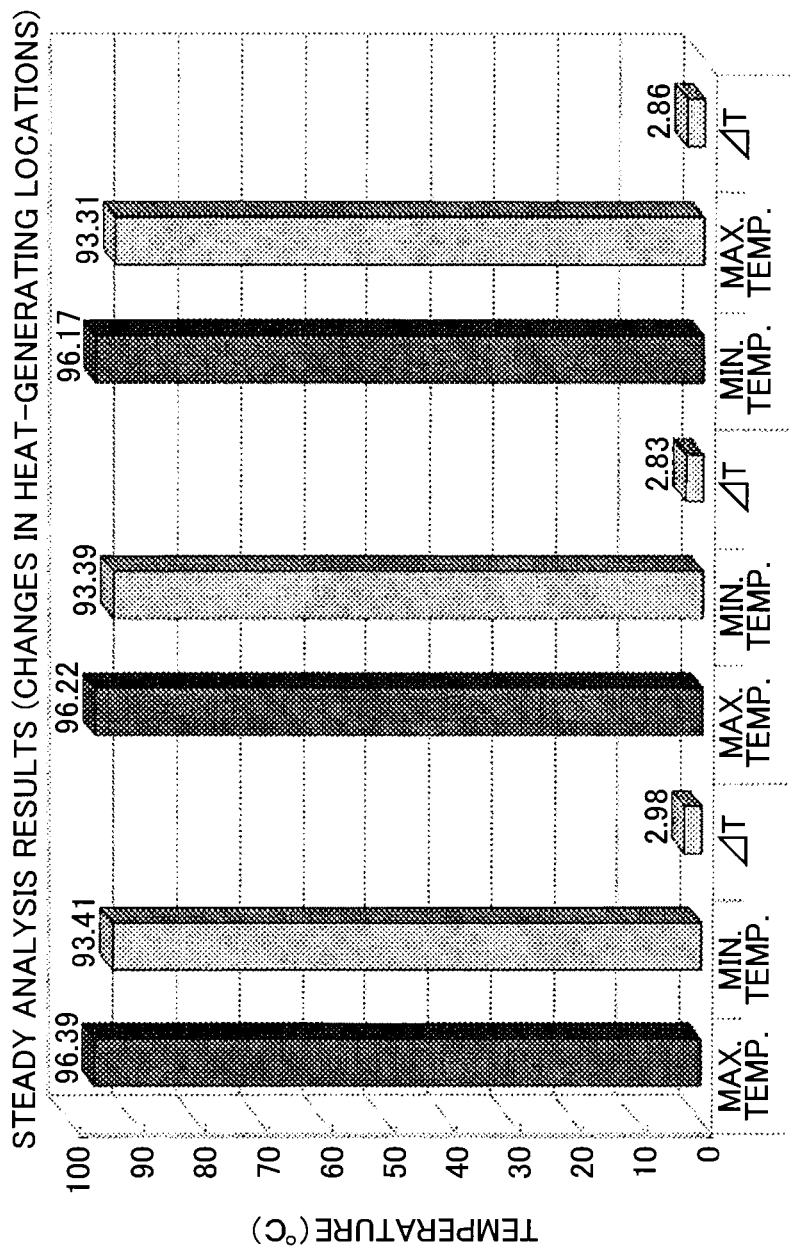
FIG. 4B shows thermal analysis results for each chip layer.
Figure 4A:
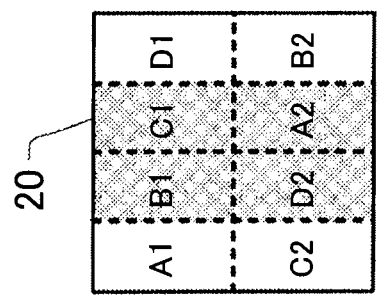
FIG. 4A is a schematic view of heat generated in each chip layer.

FIGS. 4A and 4B show thermal analysis results for each chip layer. In this thermal analysis, the ambient temperature of the semiconductor apparatus 100 was set to 45° C. As shown in FIG. 4A, the circuit regions B1, C1, D2 and A2 each generated 0.05 W of heat, resulting in a total heat of 0.2 W being generated. As shown in FIGS. 1A and 2A, the heat releasing component 50 is disposed on the upper portion of the semiconductor apparatus 100 and heat is released only through this portion, and so the sides and bottom of the semiconductor apparatus 100 were thermally isolated to prevent the release of heat. The thermal conductivity of silicon (Si) is 148 W/m° C., the specific heat is 750 J/kg° C., and the density is 2330 kg/m$^3$.

The vertical axis of the graph of FIG. 4B shows temperature states caused by differences in temperature between the chip layers. The left side of the graph shows the temperature states in a case where the circuit regions B1, C1, D2, and A2 of the first-layer chip 20-1 generate heat. In the semiconductor apparatus 100, the maximum temperature is 96.39° C. and the minimum temperature is 93.41° C. Therefore, the maximum temperature difference ΔT in the semiconductor apparatus 100 is 2.98° C.

The middle of the graph shows the temperature states in a case where the circuit regions B1, C1, D2, and A2 of the fourth-layer chip 20-4 generate heat. In the semiconductor apparatus 100, the maximum temperature is 96.22° C. and the minimum temperature is 93.39° C. Therefore, the maximum temperature difference ΔT in the semiconductor apparatus 100 is 2.83° C.

The right side of the graph shows the temperature states in a case where the circuit regions B1, C1, D2, and A2 of the eighth-layer chip 20-8 generate heat. In the semiconductor apparatus 100, the maximum temperature is 96.17° C. and the minimum temperature is 93.31° C. Therefore, the maximum temperature difference ΔT in the semiconductor apparatus 100 is 2.86° C.

The maximum temperature and maximum temperature difference ΔT are greater when the first-layer chip 20-1, which is furthest from the heat releasing component 50, generates concentrated heat. In contrast, the maximum temperature is kept lower when the eighth-layer chip 20-8, which is closest to the heat releasing component 50, generates concentrated heat. In this thermal analysis, it was assumed that a DRAM was being used and 0.0225 W of thermal energy was supplied to the circuit region B1, but a different order of thermal energy would be provided in the case of a logic LSI. Therefore, the maximum temperature and maximum temperature difference ΔT caused by differences in the location of the heat generation can be expanded beyond the actual results.

Based on the above, circuit regions that are accessed more frequently in the multi-layered semiconductor apparatus 100, which may be a DRAM, logic LSI, or the like, are desirably arranged closer to the heat releasing component 50, i.e. in the eighth layer. In other words, circuit regions 22 that have a short drive time, i.e. circuit regions 22 that are not accessed frequently, should be arranged far from the cooling heat releasing component 50, and circuit regions 22 that have a long drive time, i.e. circuit regions 22 that are accessed frequently, should be arranged near the cooling heat releasing component 50. In this way, the overall maximum temperature difference is restricted, and so the semiconductor apparatus 100 has a more even thermal distribution with few thermal anomalies.

In the present embodiment, the sealing resin 40 that contacts the heat releasing component 50 and covers the chips 20 is made of a single material, and so the thermal conduction between the circuit regions 22 and the heat releasing component 50 is uniform. Accordingly, by arranging circuit regions 22 with greater heat generation per unit area closer to the heat releasing component 50, the thermal resistance between the circuit regions 22 with greater heat generation per unit area and the heat releasing component 50 can be decreased. Instead of this, as another example, the thermal resistance between the circuit regions 22 with greater heat generation per unit area and the heat releasing component 50 may be decreased by using, as the material used to fill the space between the circuit regions 22 with greater heat generation per unit area and the heat releasing component 50, a material whose thermal conductivity is higher than that of the material used to fill the space between the circuit regions 22 with less heat generation per unit area and the heat releasing component 50.

In addition, a DRAM, which has a memory function, and a logic LSI, which has a computing function, have completely different degrees of integration and functions. Usually, the heat generated by a logic LSI per unit time is of an order greater than that of a DRAM, which generates a small amount of heat per unit area. Therefore, when forming a logic LSI layer, even if the access frequency is the same, the logic LSI is desirably arranged in the eighth layer near the heat releasing component 50. In other words, the chip 20 or circuit regions 22 that generate a large amount of heat per unit time should be arranged near the heat releasing component 50.

<<Maximum Temperature and Maximum Temperature Difference within a Single Layer>>

FIGS. 5A-1, 5A-2, 5A-3, and 5B show thermal analysis results within a single chip. In this thermal analysis, the ambient temperature of the semiconductor apparatus 100 was set to 45° C. As shown in FIGS. 1A and 1B, the heat releasing component 50 is disposed on the upper portion of the semiconductor apparatus 100 and heat is released only through this portion, and so the sides and bottom of the semiconductor apparatus 100 were thermally isolated to prevent the release of heat.

As shown in FIGS. 5A-1, 5A-2, and 5A-3, among the circuit regions 22 of the first-layer chip 20-1, the circuit regions B1 to B4 are arranged in the center, the circuit regions A1 and A3 are arranged on one side, and the circuit regions A2 and A4 are arranged on the other side.

Figures 1, 5A:
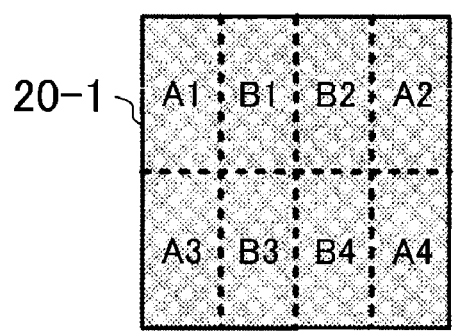
FIG. 5A-1 is a schematic view of heat generated in each chip layer.

In FIG. 5A-1, the circuit regions A1 to A4 and B1 to B4 in the first-layer chip 20-1 each generate a heat of 0.025 W. Therefore, the total heat generated by the first-layer chip 20-1 is 0.2 W. The temperature state in this case is represented on the left side of the graph of FIG. 5B. In the semiconductor apparatus 100, the maximum temperature is 96.21° C. and the minimum temperature is 93.52° C. Therefore, the maximum temperature difference ΔT in the semiconductor apparatus 100 is 2.69° C.

Figures 2, 5A:
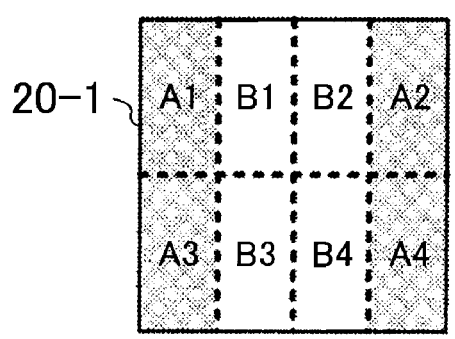

In FIG. 5A-2, the circuit regions A1 to A4 in the first-layer chip 20-1 each generate a heat of 0.05 W. Therefore, the total heat generated by the first-layer chip 20-1 is 0.2 W, which is the same amount as generated by the first-layer chip 20-1 in FIG. 5A-1. The temperature state in this case is represented in the middle of the graph of FIG. 5B. In the semiconductor apparatus 100, the maximum temperature is 96.31° C. and the minimum temperature is 93.54° C. Therefore, the maximum temperature difference ΔT in the semiconductor apparatus 100 is 2.77° C.

Figures 3, 5A:
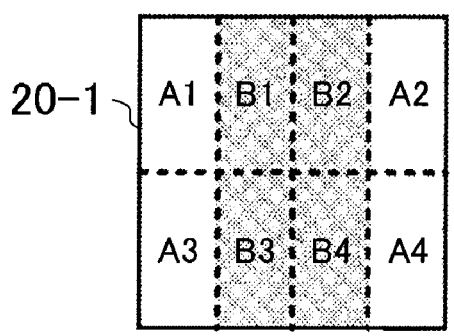

In FIG. 5A-3, the circuit regions B1 to B4 in the first-layer chip 20-1 each generate a heat of 0.05 W. Therefore, the total heat generated by the first-layer chip 20-1 is 0.5 W, which is the same amount as generated by the first-layer chip 20-1 in FIG. 5A-1. The temperature state in this case is represented on the right side of the graph of FIG. 5B. In the semiconductor apparatus 100, the maximum temperature is 96.39° C. and the minimum temperature is 93.41° C. Therefore, the maximum temperature difference ΔT in the semiconductor apparatus 100 is 2.98° C.

Based on the above, it was concluded that when there are a plurality of circuit regions 22 in a single chip 20, the maximum temperature difference can be decreased by evenly distributing the heat generation, as shown in FIG. 5A-1. Furthermore, it was concluded that when some of the plurality of circuit regions 22 generate heat, the maximum temperature difference can be decreased by arranging the heat-generating circuit regions 22 on the edges instead of in the center.

Therefore, when a portion of the circuit regions 22 in the multi-layered semiconductor apparatus 100, which may be a DRAM or a logic LSI, generate heat, the circuit regions that are accessed frequently are desirably arranged near the edges instead of in the center. In other words, the circuit regions 22 that have a long drive time, i.e. circuit regions 22 that are accessed frequently, should be arranged near the edges of the chip 20. Furthermore, when a logic LSI and a DRAM are both provided in the chip 20, even if the access frequencies are the same, the logic LSI is desirably arranged at an edge of the chip 20. In other words, circuit regions 22 that generate a large amount of heat per unit time should be arranged at the edges of the chip 20.

<<Observation of the Heat Distribution>>

The access frequency, the drive cycle time, and the amount of heat generated per unit time for each circuit region 22 is different depending on the function of the circuit region 22. The relative position of each circuit region 22 with regard to the heat releasing component 50 is also different for each circuit region 22. Taking this into consideration, the above embodiment describes optimal arrangements of the chip 20 and circuit region 22 with respect to releasing heat. This idea is further developed in the present embodiment to optimize the heat dispersion throughout the entire semiconductor apparatus 100, and the heat is controlled with these states in mind.

Figure 6B:
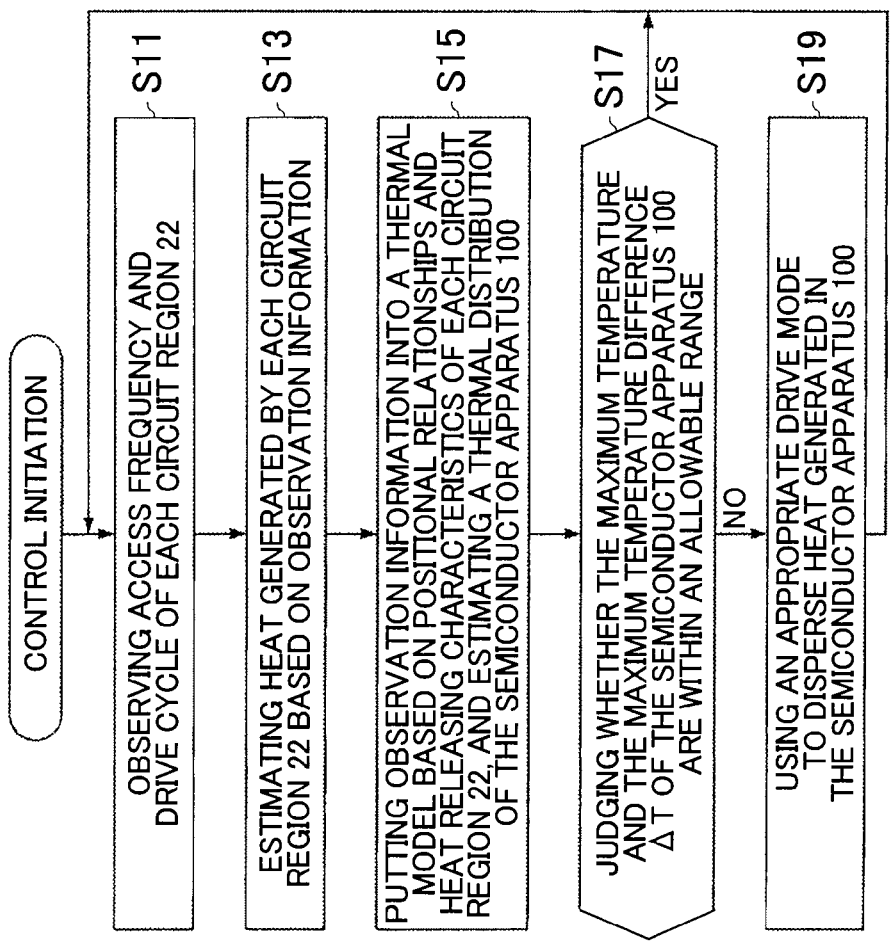
FIG. 6B is a flow chart describing the control performed by the heat control circuit region 21.
Figure 6A:
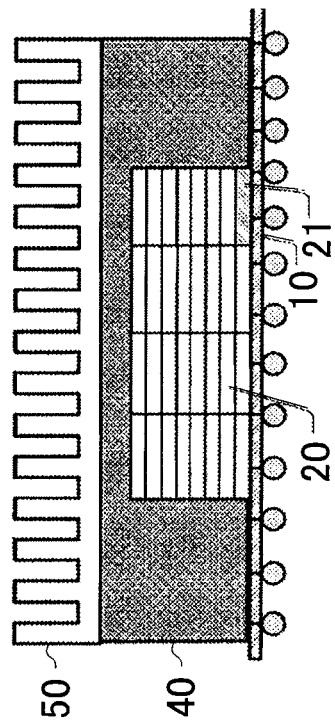
FIG. 6A shows a semiconductor apparatus 100 with almost the same structure as the semiconductor apparatus 100 of FIG. 1A, but this semiconductor apparatus 100 includes a heat control circuit region 21 in the first-layer chip 20-1 for controlling the heat.

FIG. 6A shows a semiconductor apparatus 100 with almost the same structure as the semiconductor apparatus 100 of FIG. 1A, but this semiconductor apparatus 100 includes a heat control circuit region 21 in the first-layer chip 20-1 for controlling the heat. The heat control circuit region 21 is desirably arranged in the first layer having easily observable access frequency and drive cycle time, in order to control all the circuit regions 22 in the eight layers of chips 20.

FIG. 6B is a flow chart describing the control performed by the heat control circuit region 21.

At step S11, the heat control circuit region 21 observes the access frequency and drive cycle of each circuit region 22.

At step S13, the heat control circuit region 21 estimates the heat generated by each circuit region 22, based on the observation information. Since the heat control circuit region 21 has already stored the amount of heat for one instance of accessing and drive cycle for each circuit region 22, the heat control circuit region 21 can estimate the amount of heat generated and the temperature by observing the access frequency and the drive cycles.

At step S15, the heat control circuit region 21 estimates the maximum temperature and the maximum temperature difference $\Delta T$ that occurs in the semiconductor apparatus 100 based on the estimated amount of heat generated by each circuit region 22. In the present embodiment, the maximum temperature and the maximum temperature difference $\Delta T$ of the semiconductor apparatus 100 are measured while taking into consideration the position of the heat releasing component 50, the structure having eight layers of chips 20, and the like.

At step S17, the heat control circuit region 21 judges whether the maximum temperature and the maximum temperature difference $\Delta T$ of the semiconductor apparatus 100 are within an allowable range. If these values are within the allowable range, the process returns to step S11 and the heat control circuit region 21 continues the observation. If these values are not within the allowable range, the process moves to step S19.

At step S19, the heat control circuit region 21 performs control to disperse the heat of the semiconductor apparatus 100.

In the present embodiment, the maximum temperature and the maximum temperature difference $\Delta T$ are used as parameters, but other parameters may also be used, such as the thermal gradient per unit distance.

Examples of methods that can be used in step S19 to disperse the heat are described below. Here, circuit regions 22 having the same functions are distributed in the semiconductor apparatus 100 at several locations during the design phase of the semiconductor apparatus 100. The heat control circuit region 21 performs control to decrease the frequency and duration of access to the circuit regions 22 located further from the heat releasing component 50 and to increase the frequency and duration of access to the circuit regions 22 located closer to the heat releasing component 50. With this control, the heat control circuit region 21 can guide the maximum temperature and maximum temperature difference $\Delta T$ of the semiconductor apparatus 100 into the allowable range.

One example in which circuit regions 22 having the same function are arranged at several locations in a chip 20 is when circuit regions 22 are used as a redundancy to repair defects or the like that arise during manufacturing. In addition to the circuit regions 22 that are to be used, circuit regions 22 are provided to serve as redundant circuits having the same functions as these circuit regions 22 to be used. In this case, the control described above may be performed on the circuit regions 22 to be used and on the corresponding redundant circuit regions 22.

Figure 7B:
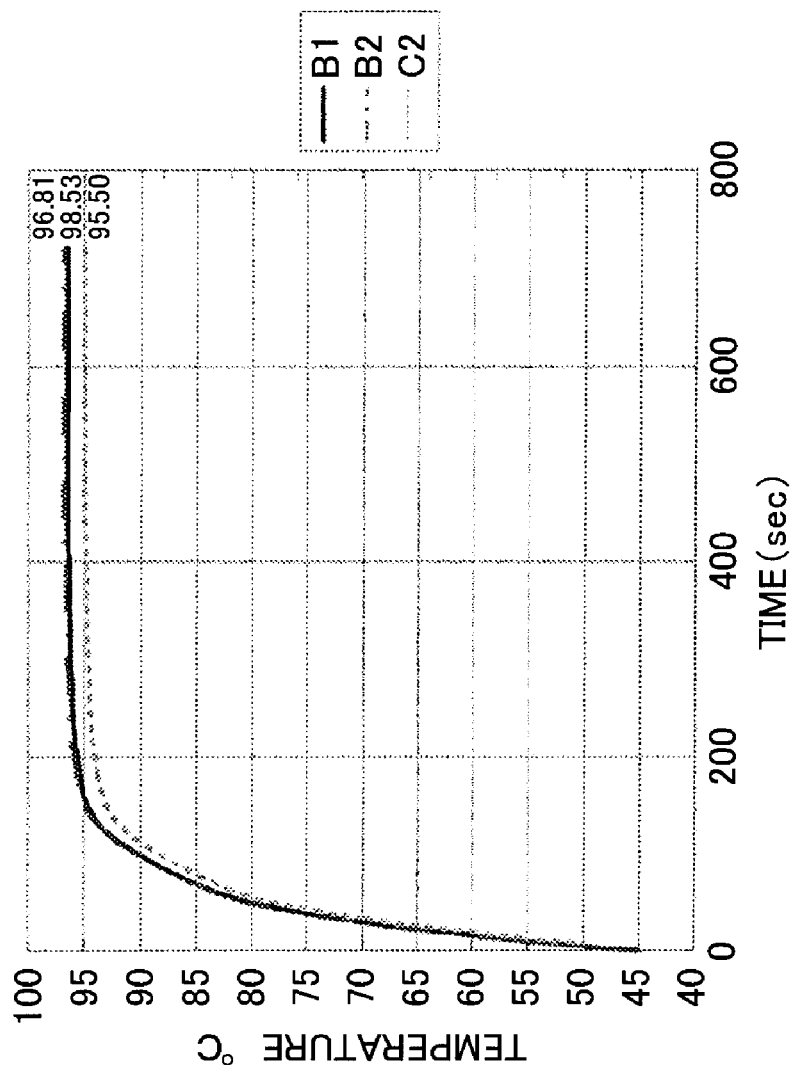
FIG. 7B is a specific example of a decrease in the maximum temperature of the semiconductor apparatus 100.
Figure 7A:
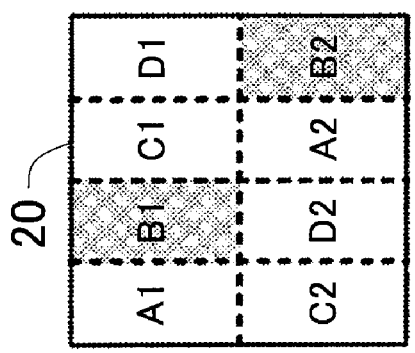
FIG. 7A is a schematic view of heat generated in each chip layer.
Figure 8:
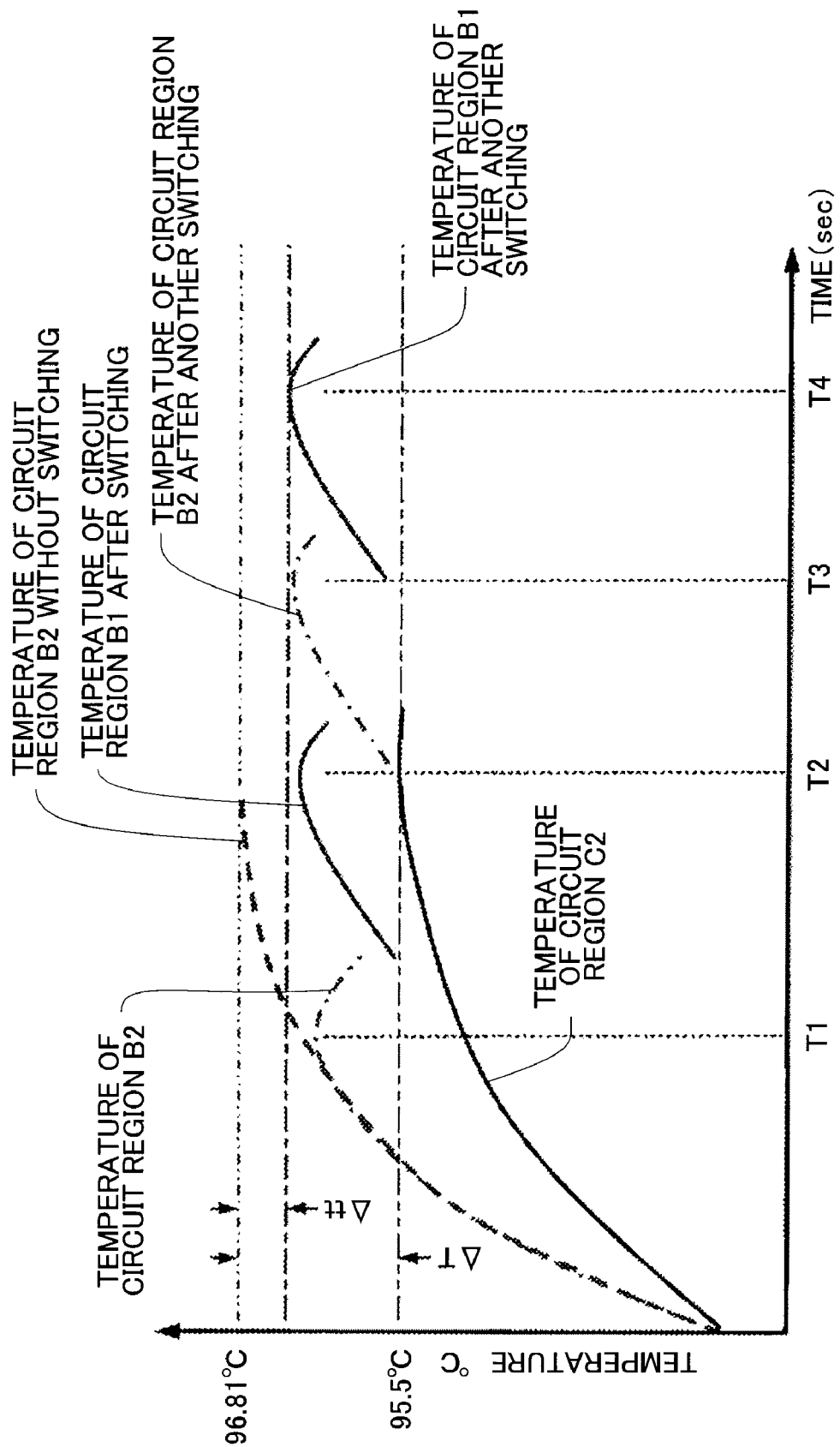
FIG. 8 is a specific example of a decrease in the maximum temperature of the semiconductor apparatus 100.

FIGS. 7A, 7B, and 8 show specific examples for decreasing the maximum temperature of the semiconductor apparatus 100. When the circuit regions B1 and B2 at two locations in the first-layer chip 20-1 continue to generate heat as shown in FIG. 7A, the temperature analysis over time shown in FIG. 7B is obtained.

In this case, the maximum temperature of the first layer in a normal state is 96.81° C. at the circuit region B2, and the minimum temperature of the first layer is 95.5° C. at the circuit region C2. Furthermore, the circuit region B1 is 96.53° C. It should be noted that the maximum temperature of the circuit region B1 is less than the maximum temperature of the circuit region B2 because the circuit region B1 is surrounded on three sides by the circuit regions A1, C1, and D2 that are made of silicon (Si) having good thermal conductivity.

Based on the results, in order to hold the first-layer maximum temperature below 96.81° C., access is switched to a circuit region 22 having the same function and located as far away as possible, before the maximum temperature of the first layer reaches 96.81° C. By sequentially switching the heat generating locations in this way before each circuit region 22 reaches the maximum temperature, the actual maximum temperature can be lowered. The following is a specific example of this effect.

FIG. 8 shows temperature increases when switching between the circuit regions B1 and B2. First, electrical input is provided only to the circuit region B2 to activate this circuit region, and therefore the temperature gradually increases. If switching is not performed, the temperature will reach 96.81° C., as shown by the dotted line. At the time T1, a switch is made from the circuit region B2 to the circuit region B1, which has the same function. The circuit region B1 already has an increased temperature due to the effect of the increased surrounding temperature, and electrical input is provided to the circuit region B1 to activate this circuit region and raise the temperature further. On the other hand, the temperature of the circuit region B2 drops.

In order to stop the temperature increase of the circuit region B1, the supply of the electrical input to the circuit region B1 is stopped and switched back to the circuit region B2 at the time T2. The temperature of the circuit region B2, which has decreased by some amount, begins increasing once again. Then, in order to stop the temperature increase of the circuit region B2, the supply of the electrical input to the circuit region B2 is stopped and switched back to the circuit region B1 at the time T3. This process continues to be repeated. Since the input energy is the same, the localization of the heat generating locations is spread out to be uniform across the entire semiconductor apparatus 100. Therefore, the entire semiconductor apparatus 100 can be driven at a prescribed temperature that is $\Delta$tt less than the maximum temperature of 96.81° C.

When switching from one circuit region to another circuit region, a third circuit region becomes a switching candidate if the temperature of the circuit region that is the original switching candidate is also high. This process continues to be repeated. If there are a plurality of candidate circuit regions, the switch may be made to the circuit region from among this plurality that is farthest from the circuit region that is being driven.

<<Heat Dispersion by Dummy Driving>>

Conventionally, dummy driving for intentionally generating heat is performed by providing electrical input to circuit regions 22 that are idle and need not be driven. Using this dummy driving prevents the thermal fluctuations from being focused only around the circuit regions 22 that are locally generating heat. This technique is particularly effective during an excess state in which the temperature difference between the heat generating regions and the regions that do not generate heat is likely to increase, such as during start-up of the circuit. If the circuit regions 22 being dummy driven are chosen from regions near positions that are left-right or up-down symmetrical with respect to the circuit region 22 generating heat, the heat deformation of the overall semiconductor apparatus 100 can be made more symmetrical, and can sometimes be avoided completely.

The circuit regions 22 being dummy driven are not constantly dummy driven, and conventional drive is performed when operation of the circuit regions 22 is necessary.

Figure 9A:
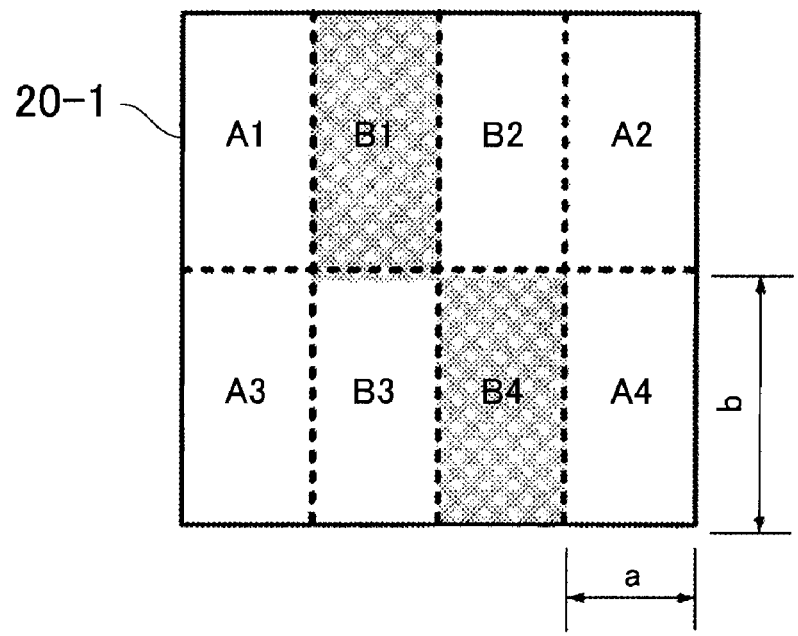
FIG. 9A is a planar view of one of the layered semiconductor chips, and shows positions of two circuit regions that generate heat at the same time.
Figure 9B:
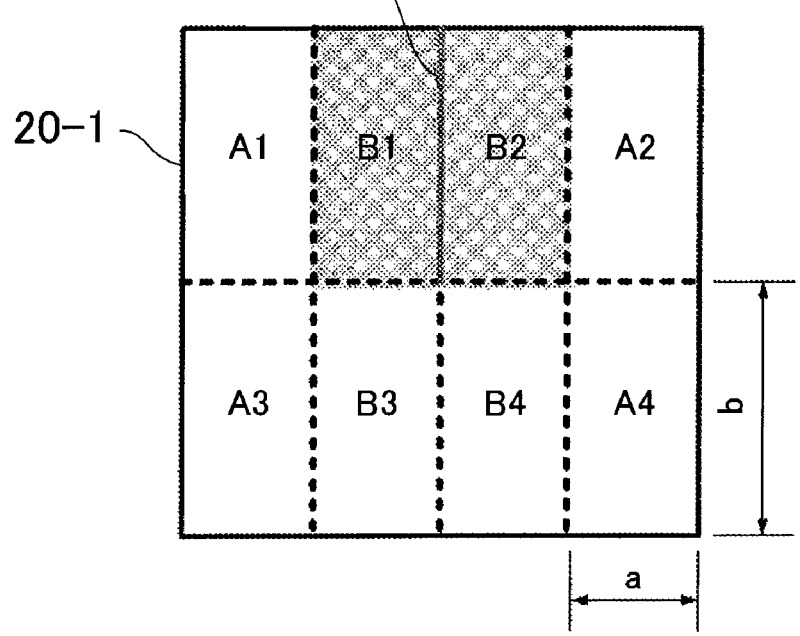
FIG. 9B is a planar view of one of the layered semiconductor chips, and shows positions of two circuit regions that generate heat at the same time.

FIGS. 9A and 9B show a comparison between the different arrangements of heat-generating circuit regions in a single chip. In FIG. 9A, the circuit regions B1 and B4 generate heat. The circuit regions B1 and B4 are arranged such that their borders are not in contact with each other, and contact only at respective corners thereof in the present embodiment. In FIG. 9B, the circuit regions B1 and B2 generate heat, and share one common border along their respective sides. The heat should flow from heat-generating regions to regions that do not generate heat, and so the temperature of the circuit regions is roughly determined by how much area of the heat-generating circuit regions is in contact with the circuit regions that do not generate heat. Accordingly, only the area of the contact between the heat generating circuit regions and the circuit regions that do not generate heat need be calculated, and this calculation can be achieved simply by calculating the area of the shared surfaces between the heat-generating circuit regions and the circuit regions that do not generate heat in a single chip layer, where each circuit region has short sides with a length of a, long sides with a length of b, and a thickness of t. It should be noted that the area S of the flat surface of each circuit region can be expressed by $S=a \times b$.

In FIG. 9A, circuit regions B1 and B4 each contact circuit regions that do not generate heat on three sides thereof; and in FIG. 9B, the heat-generating circuit regions B1 and B2 share one side with each other and each have two sides contacting circuit regions that do not generate heat. Therefore, the total area of the heat-generating circuit regions contacting circuit regions that do not generate heat in FIG. 9B is less than the total area in FIG. 9A by $S=2 \times b \times t$. The circuit regions that do not generate heat can be thought of as low-temperature heat absorbers from the perspective of the circuit regions that generate heat, and so a greater number of cooling paths can be formed by having a large number of the circuit regions that do not generate heat positioned near the circuit regions that generate heat. If it is assumed that the heat-generating circuit regions B1, B2, and B4 each generate the same amount of heat, then the arrangement of the heat-generating circuit regions shown in FIG. 9A has a greater number of cooling paths than the arrangement in FIG. 9B, and this leads to a decrease in the maximum temperature and the temperature difference, i.e. the difference between the maximum temperature and the minimum temperature, in a single chip layer. This effect was confirmed using the thermal analysis technique described above.

Although not shown in FIGS. 9A and 9B, an arrangement is also possible in which the heat-generating circuit regions and the circuit regions that do not generate heat are completely separated from each other. For example, there may be an arrangement in which only the circuit regions B1 and A4 generate heat, but with this arrangement as well, the heat-generating circuit regions contact a large number of circuit regions that do not generate heat, and so a decrease in the maximum temperature and the temperature difference, i.e. the difference between the maximum temperature and the minimum temperature, in a single chip layer can be expected. Furthermore, FIGS. 9A and 9B show examples in which a single chip layer is divided into eight equal regions, but this division is not limited to eight equal regions. The number of divisions may be greater than or less than eight. In addition, the divisions need not be equal to each other. Even if the chip layer is divided into uneven portions, the same effect as described above can be expected as long as the heat-generating circuit regions are spread out such that the areas of the shared edges thereof are minimized. The present embodiment describes rectangular divisions, but the shape of the divisions is not limited to this. FIGS. 9A and 9B show examples in which two of the eight circuit regions generate heat, but the number of heat-generating circuit regions is not limited to two. Even if three or more circuit regions generate heat, a decrease in the maximum temperature and the temperature difference, i.e. the difference between the maximum temperature and the minimum temperature, in a single chip layer can be achieved as long as these circuit regions are spread out such that the areas of the shared edges thereof are minimized. The effects in these cases were confirmed using the thermal analysis method described above.

The basic difference between FIG. 9A and FIG. 9B is that, in FIG. 9B, there is a shared border between the two adjacent heat-generating circuit regions B1 and B2 in a single chip layer, which results in a shared border area of $S=b \times t$, and this arrangement can be described according to this area. On the other hand, in FIG. 9A, the heat-generating circuit regions B1 and B4 are spread out, and contact each other only at a corner thereof. In this case, the area of shared borders is 0. The circuit regions that do not generate heat can be treated as "low-temperature heat absorbers," i.e. cooling sources, from the point of view of the heat-generating circuit regions, and so the configuration of FIG. 9A has more cooling paths than the configuration of FIG. 9B by an area of $2 \times b \times t$, which results in a decrease in the maximum temperature and in $\Delta T$. Accordingly, it is necessary to prevent circuit regions that share borders with each other from generating heat at the same time as a result of circuit operation. In other words, it is most effective to spread out first circuit regions and second circuit regions among the circuit regions 22 that generate heat at the same time due to circuit operation, such that the area of the shared borders between these regions is substantially 0.

Figure 10:
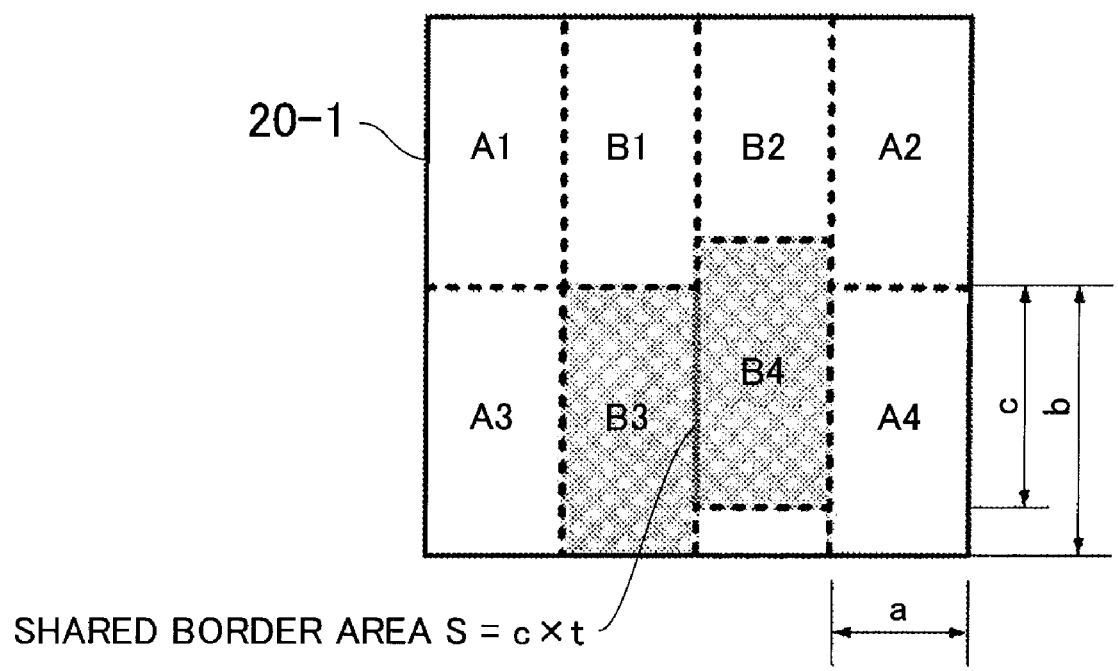
FIG. 10 is a planar view of one of the layered semiconductor chips, and shows positions of two circuit regions that generate heat at the same time.

FIG. 10 shows an exemplary arrangement of circuit regions B3 and B4, which are driven during overlapping time periods in a single chip. As shown in FIG. 10, the circuit regions B3 and B4 are arranged such that their borders are slightly misaligned from each other. Here, the circuit regions B3 and B4 have a portion of one of their edges misaligned with each other, and the remaining portion of their respective edges overlap as seen from a direction orthogonal to the shared border. In the chip having this arrangement, the area of the shared border between the circuit regions B3 and B4 is $S=c \times t$, which is less than the shared border area in FIG. 9B, and therefore there are more cooling paths.

FIGS. 11A and 11B are cross-sectional views of a semiconductor apparatus including five layers of semiconductor chips 20-1 to 20-5 that each have the eight circuit regions A1, A2, B1, B2, C1, C2, D1, and D3 shown in the planar view of FIG. 1B. FIGS. 11A and 11B show a comparison relating to the arrangement of two heat-generating circuit regions in different chip layers. In actuality, the underfill 30 and sealing resin 40 shown in FIG. 2 should also be included, but are omitted from FIGS. 11A and 11B for ease of explanation.

FIG. 11A shows an example in which the circuit region A2 in the second layer and the circuit region B1 in the fourth layer generate heat, or when the circuit region C1 in the second layer and the circuit region D2 in the fourth layer generate heat. In both of these cases, the heat-generating circuit regions are separated from each other and a layer containing no heat-generating circuit regions is interposed therebetween, and so the heat-generating circuit regions each cause the five contacting surfaces therearound to generate heat.

FIG. 11B shows an example in which the circuit region B1 in the third layer and the circuit region B1 in the fourth layer generate heat. The circuit region B1 in the third layer and the circuit region B1 in the second layer are adjacent to each other. Accordingly, when calculating the area of the two heat-generating circuit regions, which are B1 in the third layer and B1 in the fourth layer, that contacts the circuit regions that do not generate heat, the area in the configuration of FIG. 11B is lower by $S=2\times a\times b$. The circuit regions that do not generate heat can be treated as low-temperature heat absorbers from the point of view of the heat-generating circuit regions, and so having more circuit regions that do not generate heat in contact with the circuit regions B1 that do not generate heat results in a greater number of cooling paths. It is obvious that the arrangement of FIG. 11B is not limited to a case in which the circuit region B1 in the third layer and the circuit region B1 in the fourth layer are generating heat. The same effect occurs between any two adjacent semiconductor chip layers. In FIG. 11B, the circuit region B1 in the second layer and the circuit region B1 in the third layer are shown to be completely overlapping in an up and down direction, i.e. a horizontal cross-sectional direction in FIGS. 11A and 11B, but these regions might not be completely overlapping depending on the size of the circuit regions. Even if these circuit regions do not completely overlap, the heat generating circuit regions have a shared border area between adjacent chips.

The basic difference between FIG. 11A and FIG. 11B is that, in FIG. 11B, the heat-generating circuit regions in adjacent chips have a shared border, which has an area of $S=a\times b$. On the other hand, in FIG. 11A, the circuit regions that do not generate heat are spread out, such that the area of the shared borders therebetween is 0. In other words, the two heat-generating circuit regions in the configuration of FIG. 11A are not adjacent in the direction of the height, but are adjacent to each other (adjacent layers, same section) in the configuration of FIG. 11B. As a result, the configuration of FIG. 11B has a cooling path area formed by the circuit regions not generating heat this is $2\times S$ less than the cooling path area in FIG. 11A, and so this configuration can be used to achieve a drop in the maximum temperature difference $\Delta T$ due to thermal distribution skew and a drop in the maximum temperature for the multi-layered semiconductor apparatus. In actuality, the underfill 30 shown in FIGS. 2A and 2B is interposed between each layer in the multi-layered semiconductor chip, but the underfill 30 exhibits negligible cooling effect as seen from the circuit regions that are only slightly heated.

In this way, in first and second adjacent semiconductor chips in a multi-layered semiconductor apparatus having a plurality of semiconductor chips 20, it is necessary for a first circuit region that generates heat due to operation in the first semiconductor chip and a second circuit region that generates heat due to operation in the second semiconductor chip to be spread out so as to not have a shared border therebetween.

Figure 12A:
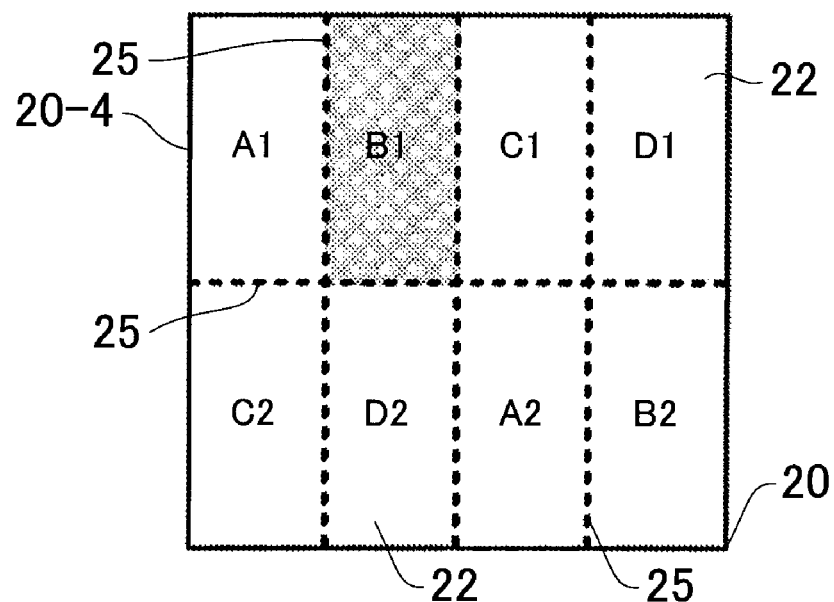
FIG. 12A is a planar view of two of the layered semiconductor chips, and shows positions of two circuit regions that generate heat at the same time.
Figure 12B:
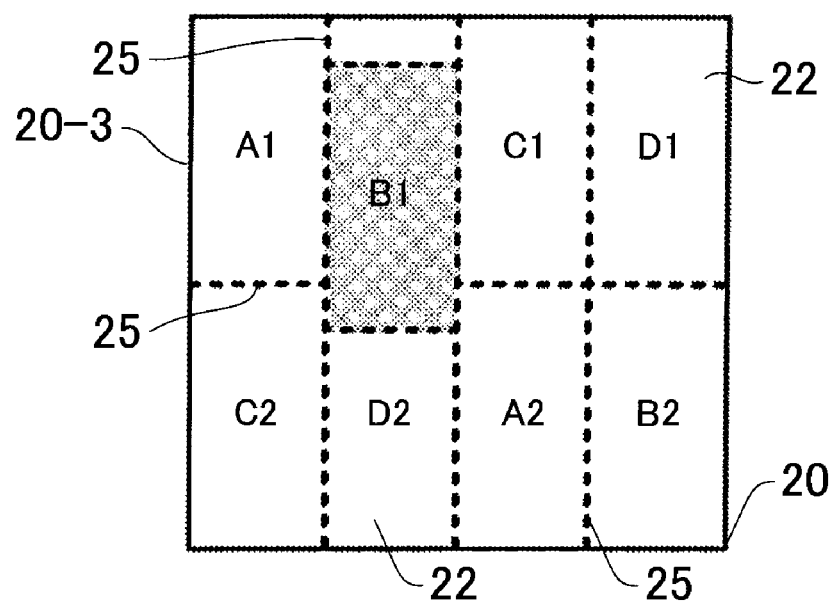
FIG. 12B is a planar view of two of the layered semiconductor chips, and shows positions of two circuit regions that generate heat at the same time.

This means that the first and second circuit regions must be arranged such that their borders are misaligned to not fully contact each other. In such a case, the release of heat can be efficiently increased by having the first and second circuit regions contacting each other only at a corner or along only a portion of their borders. However, as shown in FIGS. 12A and 12B, when the first and second circuit regions are partially misaligned as seen in the direction of the chip layering such that only a portion of their border is shared, this configuration has less shared border area between the first and second circuit regions than the configuration of FIG. 11B, and this increases the amount of cooling paths.

FIG. 13 shows an exemplary arrangement of circuit regions B1. As shown in FIG. 13, when a plurality of circuit regions B1 that operate during overlapping time periods are arranged adjacently in the direction of the chip layering, a region that does not generate heat, which is at least one layer that is not driven, is included in the column of circuit regions B1 that are aligned in the chip layering direction. As a result, a heat release path in the chip layering direction can be preserved.

It is clear that the first and second circuit regions are accessed for a longer time than the other circuit regions. If the first and second circuit regions are logic circuit regions, then these circuit regions generate a greater amount of heat than the other circuit regions, and therefore the configuration of the present embodiment is particularly effective. As shown in FIG. 6, a heat control circuit region 21 may be provided in the first-layer chip 20-1 to control all the circuit regions 22 in the eight layers of chips 20.

<Heat Generation of the Semiconductor Apparatus>

The following is a more detailed thermal analysis of the heat distribution of the heat-generating circuit regions described in FIGS. 9A to 13.

FIGS. 14 to 17 show the results of a thermal analysis indicating how the heat distribution changes according to the area of the shared borders of the circuit regions.

Figure 14:
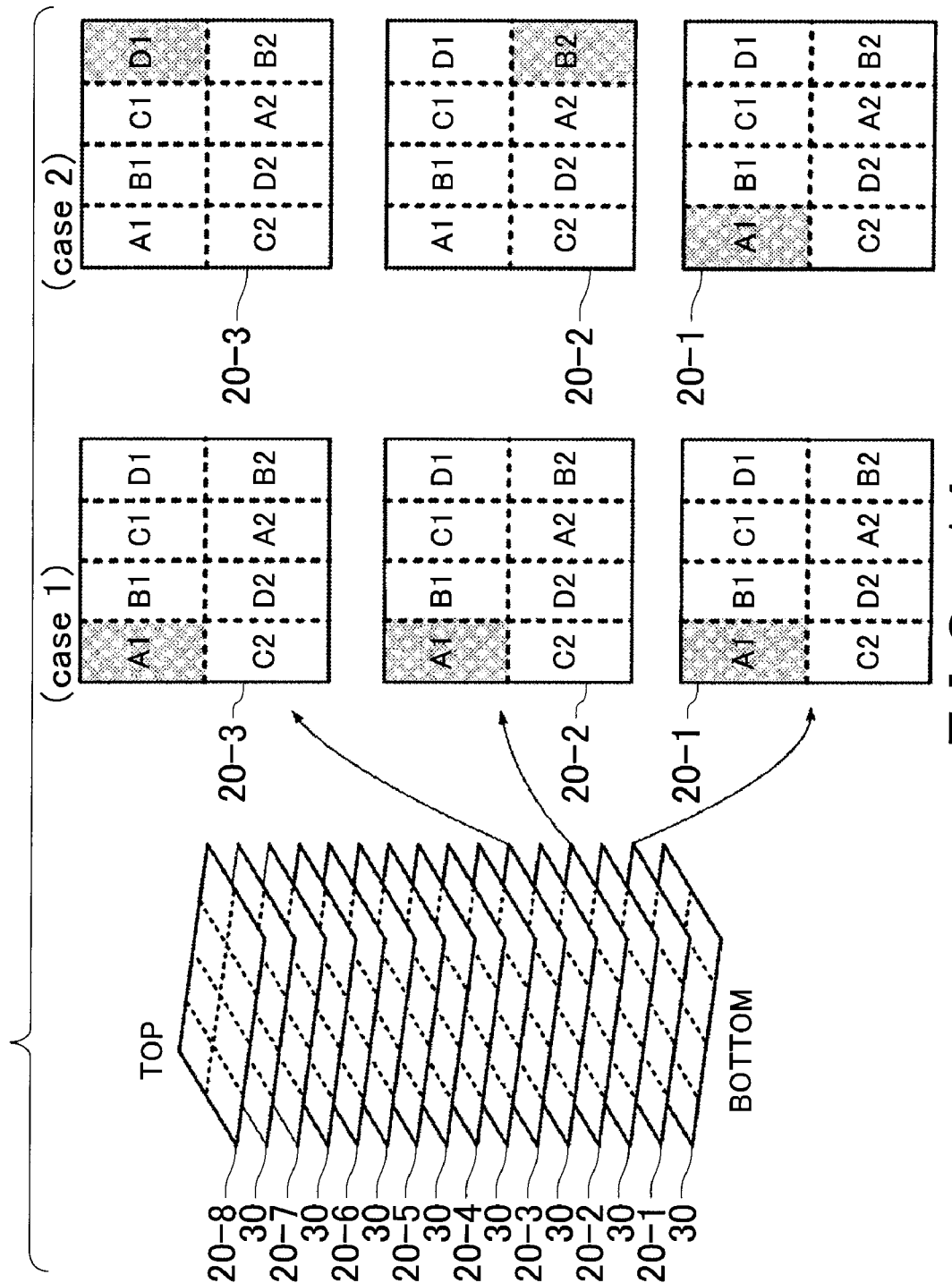
FIG. 14 is a schematic diagram showing the underfill 30 and the chip 20 in each layer of the semiconductor apparatus 100 in case 1 and case 2 having different circuit regions generating heat.

The left side of FIG. 14 is a schematic view of each chip 20 and the underfill 30 of the semiconductor apparatus 100 of the first embodiment shown in FIG. 3A. In case 1, the circuit region A1 of the first-layer chip 20-1, the circuit region A1 of the second-layer chip 20-2, and the circuit region A1 of the third-layer chip 20-3 generate heat. In case 2, the circuit region A1 of the first-layer chip 20-1, the circuit region B2 of the second-layer chip 20-2, and the circuit region D1 of the third-layer chip 20-3 generate heat. Accordingly, the circuit regions in case 1 have a large amount of shared borders, and the circuit regions in case 2 have a small amount of shared borders. In both case 1 and case 2, the total heat generated by the three heat-generating circuit regions is 0.2 W and the conditions for the release of heat to the outside are the same.

Figure 15:
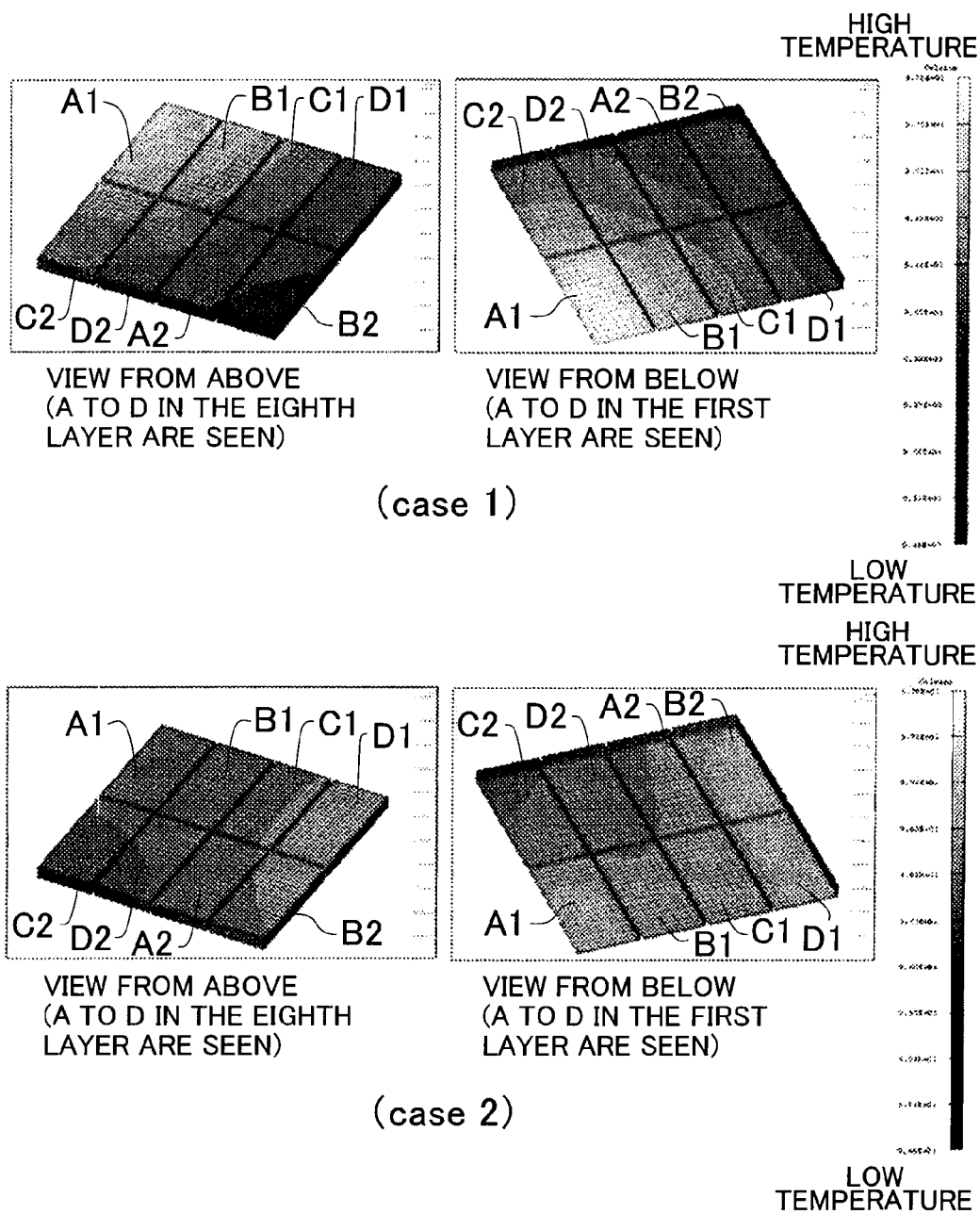
FIG. 15 shows thermal analysis results for case 1 on the top and shows thermal analysis results for case 2 on the bottom.

FIG. 15 shows the results of the thermal analysis of the semiconductor apparatus 100. The thermal analysis results for case 1 are shown at the top and the thermal analysis results for case 2 are shown at the bottom. In FIG. 15, case 1 and case 2 are shown with the underfill 30 omitted, for ease of explanation. In the thermal analysis of FIG. 15, light color (white) indicates a high temperature and dark color (black) indicates a low temperature.

The result shown on the left side in case 1 is the heat distribution of the eighth-layer chip 20-8 obtained as the thermal analysis distribution as seen from the top of FIG. 14. The temperature of the eighth-layer chip 20-8 gradually decreases from the circuit region A1 to the circuit region B2. The result shown on the right side in case 1 is the heat distribution of the first-layer chip 20-1 obtained as the thermal analysis distribution as seen from the top of FIG. 14. From this result, it is understood that the temperature of the circuit region A1 in the first-layer chip 20-1 is extremely high, and the temperature gradually decreases from the circuit region A1 to the circuit region B2. It is further seen that a temperature difference greater than 2.4° C. occurs due to just the first-layer chip 20-1.

The result shown on the left side in case 2 is the heat distribution of the eighth-layer chip 20-8 obtained as the thermal analysis distribution as seen from the top of FIG. 14. The temperature of the eighth-layer chip 20-8 gradually decreases from the circuit region D1 to the circuit region C2. The temperature difference of each circuit region in the eighth-layer chip 20-8 is no greater than 0.6° C., which is an extremely low temperature difference. The result shown on the right side in case 2 is the heat distribution of the first-layer chip 20-1 obtained as the thermal analysis distribution as seen from the top of FIG. 14. The temperatures of the circuit regions A1, B2, and D1 in the first-layer chip 20-1 are high, and the temperatures of the circuit regions B1, C1, and C2 are low. From this, it is understood that the circuit region A1 of the first-layer chip 20-1 generates heat, but this heat is diffused among other circuit regions, and it is also understood that the circuit regions B2 and D1 in the first-layer chip 20-1 absorb the heat generated by the circuit region B2 in the second-layer chip 20-2 and the circuit region D1 in the third-layer chip 20-3.

<<Maximum Temperature, Minimum Temperature, and Maximum Temperature Difference of the Semiconductor Apparatus>>

Figure 16A:
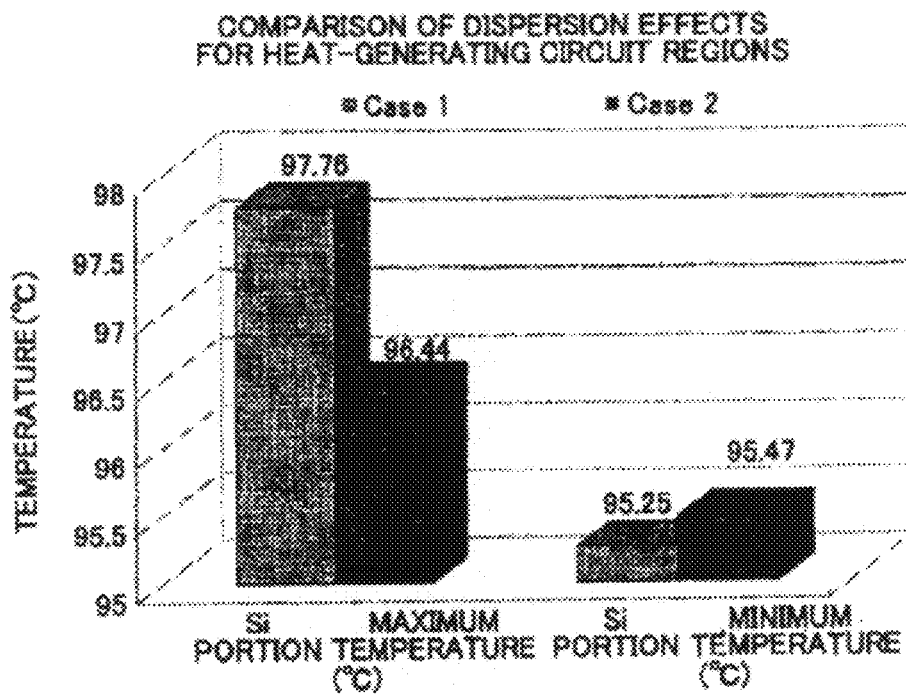
FIG. 16A is a graph showing the thermal analysis results for the semiconductor apparatus in case 1 and case 2.

FIG. 15 is a graph of the thermal analysis results of the semiconductor apparatus in case 1 and case 2. The graph of FIG. 16A shows a first comparison of a dispersion effect of the heat-generating circuit regions, and the vertical axis represents temperature. The left side of this graph shows the maximum temperature of the circuit regions of the semiconductor apparatus 100 in case 1 and case 2, and the right side of this graph shows the minimum temperature of the circuit regions of the semiconductor apparatus 100 in case 1 and case 2.

Figure 16B:
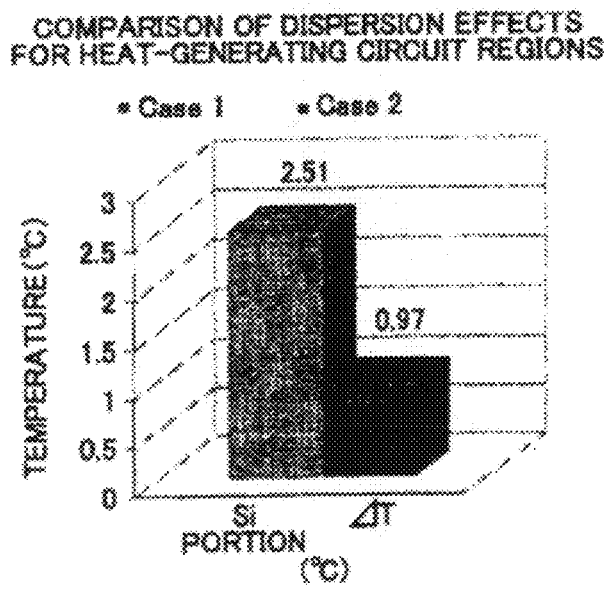
FIG. 16B is a graph showing the thermal analysis results for the semiconductor apparatus in case 1 and case 2.

In case 1, the maximum temperature in the semiconductor apparatus 100 is 97.76° C. and the minimum temperature is 95.25° C., as shown in FIG. 16A. Therefore, as shown in FIG. 16B, the maximum temperature difference ΔT in the semiconductor apparatus 100 is 2.51° C.

In case 2, the maximum temperature in the semiconductor apparatus 100 is 96.44° C. and the minimum temperature is 95.47° C., as shown in FIG. 16A. Therefore, as shown in FIG. 16B, the maximum temperature difference ΔT in the semiconductor apparatus 100 is 0.97° C. The temperature difference can be decreased by more than half by decreasing the amount of shared borders between heat-generating circuit regions.

<<A Semiconductor Apparatus Housing Eight DRAMs and a Controller LSI>>

Figure 17:
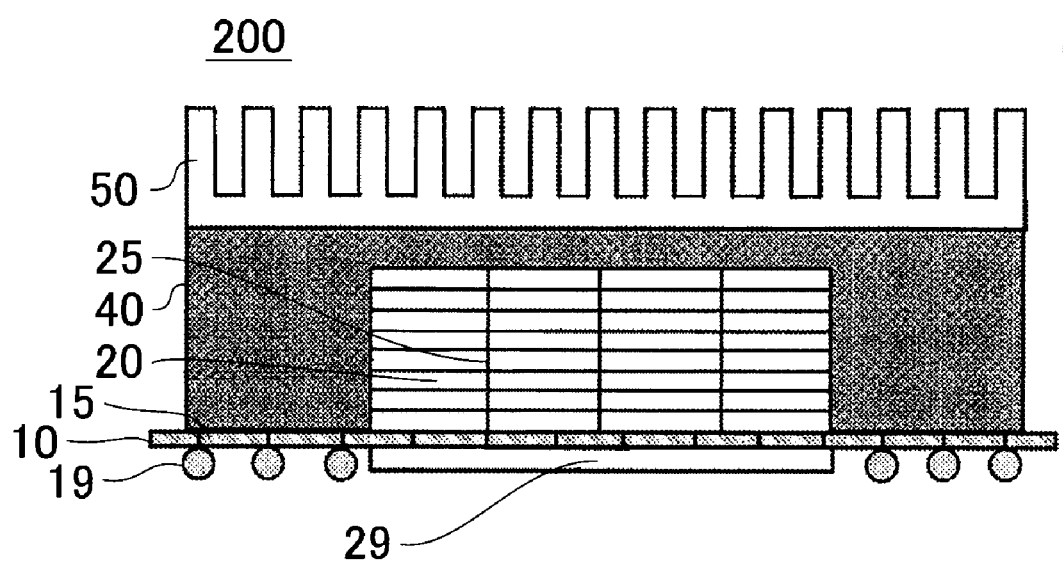
FIG. 17 shows a semiconductor apparatus having eight DRAMs and one controller LSI.

FIG. 17 shows a semiconductor apparatus 200 having eight layers of semiconductor chips 20-1 to 20-8, and specifically includes eight 512 Mb DRAMs and one logic LSI (controller LSI) 29 in a single package. Components that are the same as those in FIG. 1 are given the same reference numerals.

FIG. 14 shows an example in which the underfill 30 is formed between the first-layer chip 20-1 and the second-layer chip 20-2, but, as show in FIG. 17, an interposer 10 serving as a relay board and having connection circuitry formed thereon is provided on the bottom of the semiconductor apparatus 200, and the logic LSI 29 is provided below the interposer 10. When the interposer 10 is used instead of the underfill 30, it is still desirable to minimize the amount of shared borders between heat-generating circuit regions. Since the entire logic LSI 29 generates heat, it is desirable to use the first-layer circuit regions as little as possible in order to minimize the amount of shared borders between the circuit regions 22 in the eight layers of semiconductor chips 20.

<Arrangement of the Heat Releasing Component>

In the embodiments described above, the semiconductor apparatus 100 may include the heat releasing component 50 on the top of the sealing resin 40, as shown in FIG. 1, but as shown in FIG. 18, various other cooling methods can be used.

FIGS. 18A to 18D show arrangements that involve providing the semiconductor apparatus with cooling pipes 52 instead of the heat releasing component 50. The second semiconductor apparatus 110 shown in FIG. 18A is different from the first semiconductor apparatus 100 shown in FIG. 1A in that the second semiconductor apparatus 110 has the heat releasing component 50 provided on the sides of the sealing resin 40 instead of on top of the sealing resin 40. In the second semiconductor apparatus 110, instead of the heat escaping easily from the eighth-layer chip 20-1, the heat from all of the chips can escape easily from the sides of the chips 20.

The third semiconductor apparatus 120 shown in FIG. 18B is different from the second semiconductor apparatus 110 shown in FIG. 18A in that the third semiconductor apparatus 120 is provided with cooling pipes 52 instead of the heat releasing component 50. Instead of using air cooling with the heat releasing component 50, a stronger and more controlled cooling can be achieved by passing a coolant, such as water, through the cooling pipes 52. In this case as well, heat can easily escape from the sides of the chips 20.

The fourth semiconductor apparatus 130 shown in FIG. 18C is provided with cooling pipes 52 in addition to the configuration of the first semiconductor apparatus 110 shown in FIG. 1A. With this configuration, the air cooling by the heat releasing component 50 allows heat to escape from the top, and a large amount of heat can also escape from the sides.

FIG. 18D is a partial magnified view of the fifth semiconductor apparatus. The fifth semiconductor apparatus has a configuration in which microdrains 54 are arranged in the underfill 30 between the chips 20. This configuration includes cooling pipes 52 in addition to the first semiconductor apparatus 110. By passing a coolant such as water through the microdrains 54, the chips can be cooled more directly. The microdrains 54 may be used alone for cooling, or may be used in conjunction with the heat releasing component 50.

The embodiments described above can be applied to any of the second semiconductor apparatus 110, the third semiconductor apparatus 120, the fourth semiconductor apparatus 130, and the fifth semiconductor apparatus 200.

In the embodiments described above, some components are described as being close to or far from the heat releasing component 50, but this assumes that the sealing resin 40 serving as insulation has uniform thermal conductivity. If there is the same thermal conductivity between the heat releasing component 50 and the heat-generating sources, it is difficult for heat far from the heat releasing component 50 to escape and is easy for heat near the heat releasing component 50 to escape. On the other hand, if a material with high thermal conductivity is provided between the heat releasing component 50 and the heat generating sources, the heat that is far from the heat releasing component 50 can also escape easily. Therefore, in general terms, a state in which it is difficult for heat to escape is a state having a high thermal resistance or a low thermal conductance, and a state in which it is easy for heat to escape is a state having a low thermal resistance or a high thermal conductance.

In the above embodiments, the heat control circuit region 21 is arranged in the first-layer chip 20-1, but the heat control circuit region 21 may be arranged in the second-layer chip 20-2 instead. The heat control circuit region 21 need not be provided to the semiconductor apparatus 100, and the thermal distribution of the semiconductor apparatus 100 may instead be controlled by another semiconductor apparatus. Furthermore, the above description involves circuit regions 22 formed by dividing a chip 20 into eight regions, but the same effects can be achieved if each circuit region 22 is further divided into a plurality of special-purpose circuit regions.

In the above embodiments, the heat releasing component 50 and the cooling pipes 52 are provided to the semiconductor apparatus 100, but overall heat release can be achieved without providing the heat releasing component 50 and the cooling pipes 52 by forming the sealing resin 40 of a material with high thermal conductivity.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, the embodiments of the present invention can be used to decrease the amount of operational errors and decrease the likelihood that circuits of the multi-layered semiconductor apparatus will be damaged due to thermal stress, because the heat generated by the circuit regions of a plurality of layered semiconductor chips can be dispersed.

What is claimed is:

1. A multi-layered semiconductor apparatus comprising:
a plurality of layered semiconductor chips, each of the chips includes at least one circuit region, wherein the circuit regions are arranged such that heat generated by the circuit regions as a result of the circuit regions being driven is spread out; and
a heat releasing section that releases the heat generated by the circuit regions, wherein
the circuit regions are arranged such that there is less thermal resistance between the heat releasing section and circuit regions that generate a greater amount of heat per unit area.

2. The multi-layered semiconductor apparatus according to claim 1, comprising a sealing portion that wraps around the plurality of circuit regions, contacts the heat releasing section, and is formed of a single material, wherein
the circuit regions are arranged such that circuit regions that generate a greater amount of heat per unit area are closer to the heat releasing section.

3. The multi-layered semiconductor apparatus according to claim 1, wherein
the circuit region that generates the greatest amount of heat per unit area is a logic circuit region.

4. The multi-layered semiconductor apparatus according to claim 1, wherein circuit regions having longer access times generate a greater amount of heat per unit area.

5. The multi-layered semiconductor apparatus according to claim 1, wherein
one of the semiconductor chips is connected to a thin circuit board that changes circuit dimensions between the semiconductor chips and an external board.

6. A multi-layered semiconductor apparatus including a plurality of layered semiconductor chips that each include at least one circuit region, the semiconductor apparatus comprising a control circuit that i) controls timing of driving of the circuit regions, the driving resulting in heat generated by the circuit regions, and ii) controls how the heat is spread out based on the timing.

7. The multi-layered semiconductor apparatus according to claim 6, wherein
the control circuit estimates temperatures of driven circuit regions or heat generated by driven circuit regions to control driving of the circuit regions.

8. The multi-layered semiconductor apparatus according to claim 7, wherein
the control circuit observes drive cycles or drive times of the circuit regions and estimates the temperatures of the circuit regions or heat generated by the circuit regions based on the drive cycles or the drive times.

9. The multi-layered semiconductor apparatus according to claim 7, comprising a plurality of circuit regions having the same function, wherein
when the amount of generated heat or the temperature of one of the circuit regions having the same function being driven exceeds a threshold value, the control circuit switches driving to another circuit region having the same function.

10. The multi-layered semiconductor apparatus according to claim 6, comprising:
a heat releasing section that releases heat generated by the circuit regions; and
a plurality of circuit regions having the same function, wherein
from among the circuit regions having the same function, the control circuit allocates a greater drive time to circuit regions for which there is less thermal resistance between the circuit region and the heat releasing section.

11. The multi-layered semiconductor apparatus according to claim 6, wherein
at least one of the circuit regions is used as a dummy circuit region for heat generation.

12. A multi-layered semiconductor apparatus including a plurality of layered semiconductor chips that each include at least one circuit region, wherein
at least one of the semiconductor chips includes a plurality of circuit regions that are driven during overlapping time periods, and
the circuit regions that are driven during overlapping time periods included in a single semiconductor chip are arranged to be separated from each other.

13. The multi-layered semiconductor apparatus according to claim 12, wherein
the circuit region that generates the greatest amount of heat per unit area is a logic circuit region.

14. The multi-layered semiconductor apparatus according to claim 12, wherein
circuit regions having longer access times generate a greater amount of heat per unit area.

15. The multi-layered semiconductor apparatus according to claim 12, wherein
a reinforcing agent that reinforces bonding between the semiconductor chips or relay boards that electrically connect the semiconductor chips to each other are provided between the semiconductor chips.

16. A multi-layered semiconductor apparatus including a plurality of layered semiconductor chips that each include at least one circuit region, wherein
a plurality of circuit regions that are operable to be driven during overlapping time periods contact each other within at least one of the semiconductor chips, and the circuit regions that are operable to be driven during overlapping time periods are arranged such that at least portions thereof are misaligned along a shared border therebetween.

17. The multi-layered semiconductor apparatus according to claim 16, wherein
the circuit region that generates the greatest amount of heat per unit area is a logic circuit region.

18. The multi-layered semiconductor apparatus according to claim 16, wherein
circuit regions having longer access times generate a greater amount of heat per unit area.

19. The multi-layered semiconductor apparatus according to claim 16, wherein
a reinforcing agent that reinforces bonding between the semiconductor chips or relay boards that electrically connect the semiconductor chips to each other are provided between the semiconductor chips.

20. The multi-layered semiconductor apparatus according to claim 16, wherein
the circuit regions that are driven during overlapping time periods have corners, and are arranged to contact each other at the corners.

21. The multi-layered semiconductor apparatus according to claim 16, further comprising a heat releasing section that releases the heat generated by the circuit regions, wherein the circuit regions are arranged such that there is less thermal resistance between the heat releasing section and circuit regions that generate a greater amount of heat per unit area.

22. The multi-layered semiconductor apparatus according to claim 21, comprising a sealing portion that wraps around the plurality of circuit regions, contacts the heat releasing section, and is formed of a single material, wherein the circuit regions are arranged such that circuit regions that generate a greater amount of heat per unit area are closer to the heat releasing section.

23. The multi-layered semiconductor apparatus according to claim 21, wherein the circuit region that generates the greatest amount of heat per unit area is a logic circuit region.

24. The multi-layered semiconductor apparatus according to claim 21, wherein circuit regions having longer access times generate a greater amount of heat per unit area.

25. The multi-layered semiconductor apparatus according to claim 21, wherein one of the semiconductor chips is connected to a thin circuit board that changes circuit dimensions between the semiconductor chips and an external board.

26. A multi-layered semiconductor apparatus including a plurality of layered semiconductor chips that each include at least one circuit region, wherein
a first semiconductor chip, which is one of the plurality of semiconductor chips, includes a first circuit region that is operable to be driven,
a second semiconductor chip, which is one of the plurality of semiconductor chips and is arranged to contact the first semiconductor chip, includes a second circuit region that is operable to be driven during a time period that overlaps with a time period during which the first circuit region is operable to be driven, and
the first circuit region and the second circuit region include areas that do not overlap with each other in the direction in which the plurality of semiconductor chips are layered.

27. The multi-layered semiconductor apparatus according to claim 26, wherein
the circuit region that generates the greatest amount of heat per unit area is a logic circuit region.

28. The multi-layered semiconductor apparatus according to claim 26, wherein
circuit regions having longer access times generate a greater amount of heat per unit area.

29. The multi-layered semiconductor apparatus according to claim 26, wherein
a reinforcing agent that reinforces bonding between the semiconductor chips or relay boards that electrically connect the semiconductor chips to each other are provided between the semiconductor chips.

30. The multi-layered semiconductor apparatus according to claim 26, wherein at least one circuit region includes a memory function and at least one circuit region includes a computing function.

31. The multi-layered semiconductor apparatus according to claim 26, further comprising a heat releasing section that releases the heat generated by the circuit regions, wherein the circuit regions are arranged such that there is less thermal resistance between the heat releasing section and circuit regions that generate a greater amount of heat per unit area.

32. The multi-layered semiconductor apparatus according to claim 31, comprising a sealing portion that wraps around the plurality of circuit regions, contacts the heat releasing section, and is formed of a single material, wherein the circuit regions are arranged such that circuit regions that generate a greater amount of heat per unit area are closer to the heat releasing section.

33. The multi-layered semiconductor apparatus according to claim 31, wherein the circuit region that generates the greatest amount of heat per unit area is a logic circuit region.

34. The multi-layered semiconductor apparatus according to claim 31, wherein circuit regions having longer access times generate a greater amount of heat per unit area.

35. The multi-layered semiconductor apparatus according to claim 31, wherein one of the semiconductor chips is connected to a thin circuit board that changes circuit dimensions between the semiconductor chips and an external board.

36. A multi-layered semiconductor apparatus including a plurality of layered semiconductor chips that each include at least one circuit region, wherein
a first semiconductor chip, which is one of the plurality of semiconductor chips, includes a first circuit region that is operable to be driven,
a second semiconductor chip, which is one of the plurality of semiconductor chips and is arranged to contact the first semiconductor chip, includes a second circuit region that is operable to be driven during a time period that overlaps with a time period during which the first circuit region is operable to be driven, and
the first circuit region and the second circuit region are arranged such that at least portions thereof are misaligned along a shared border therebetween.

37. The multi-layered semiconductor apparatus according to claim 36, wherein
the circuit region that generates the greatest amount of heat per unit area is a logic circuit region.

38. The multi-layered semiconductor apparatus according to claim 36, wherein
circuit regions having longer access times generate a greater amount of heat per unit area.

39. The multi-layered semiconductor apparatus according to claim 36, wherein
a reinforcing agent that reinforces bonding between the semiconductor chips or relay boards that electrically connect the semiconductor chips to each other are provided between the semiconductor chips.

40. The multi-layered semiconductor apparatus according to claim 36, wherein
the first circuit region and the second circuit region have corners, and are arranged to contact each other at the corners.

41. The multi-layered semiconductor apparatus according to claim 36, further comprising a heat releasing section that releases the heat generated by the circuit regions, wherein the circuit regions are arranged such that there is less thermal resistance between the heat releasing section and circuit regions that generate a greater amount of heat per unit area.

42. The multi-layered semiconductor apparatus according to claim 40, comprising a sealing portion that wraps around the plurality of circuit regions, contacts the heat releasing section, and is formed of a single material, wherein the circuit regions are arranged such that circuit regions that generate a greater amount of heat per unit area are closer to the heat releasing section.

43. The multi-layered semiconductor apparatus according to claim 40, wherein the circuit region that generates the greatest amount of heat per unit area is a logic circuit region.

44. The multi-layered semiconductor apparatus according to claim 40, wherein circuit regions having longer access times generate a greater amount of heat per unit area.

45. The multi-layered semiconductor apparatus according to claim 40, wherein one of the semiconductor chips is connected to a thin circuit board that changes circuit dimensions between the semiconductor chips and an external board.

46. A multi-layered semiconductor apparatus including a plurality of layered semiconductor chips that each include at least one circuit region, the multi-layered semiconductor apparatus comprising:
a first semiconductor chip, which is one of the plurality of semiconductor chips, including a first circuit region that is operable to be driven;
a second semiconductor chip, which is one of the plurality of semiconductor chips, including a second circuit region that overlaps with the first circuit region in a direction of the chip layering and that is operable to be driven during a time period that overlaps with a time period during which the first circuit region is operable to be driven; and
a third semiconductor chip provided between the first semiconductor chip and the second semiconductor chip, the third semiconductor chip including a non-heat-generating region arranged between the first circuit region and the second circuit region.

47. The multi-layered semiconductor apparatus according to claim 46, wherein
the circuit region that generates the greatest amount of heat per unit area is a logic circuit region.

48. The multi-layered semiconductor apparatus according to claim 46, wherein
circuit regions having longer access times generate a greater amount of heat per unit area.

49. The multi-layered semiconductor apparatus according to claim 46, wherein a drive circuit region that is operable to be driven is provided on the first circuit region or the second circuit region.

50. The multi-layered semiconductor apparatus according to claim 46, further comprising a heat releasing section that releases the heat generated by the circuit regions, wherein the circuit regions are arranged such that there is less thermal resistance between the heat releasing section and circuit regions that generate a greater amount of heat per unit area.

51. The multi-layered semiconductor apparatus according to claim 50, comprising a sealing portion that wraps around the plurality of circuit regions, contacts the heat releasing section, and is formed of a single material, wherein the circuit regions are arranged such that circuit regions that generate a greater amount of heat per unit area are closer to the heat releasing section.

52. The multi-layered semiconductor apparatus according to claim 50, wherein the circuit region that generates the greatest amount of heat per unit area is a logic circuit region.

53. The multi-layered semiconductor apparatus according to claim 50, wherein circuit regions having longer access times generate a greater amount of heat per unit area.

54. The multi-layered semiconductor apparatus according to claim 50, wherein one of the semiconductor chips is connected to a thin circuit board that changes circuit dimensions between the semiconductor chips and an external board.

55. A multi-layered semiconductor apparatus including a plurality of layered semiconductor chips that each include at least one circuit region, the multi-layered semiconductor apparatus comprising:
a first semiconductor chip including a first circuit region;
a second semiconductor chip including a second circuit region that overlaps with the first circuit region in a direction of the chip layering and that is driven during a time period that overlaps with a time period during which the first circuit region is driven;
a non-heat-generating region arranged between the first circuit region and the second circuit region; and
a relay board that is arranged between the first semiconductor chip and the second semiconductor chip to electrically connect the first semiconductor chip and the second semiconductor chip, wherein the non-heat-generating region is arranged in the relay board.

56. The multi-layer semiconductor apparatus according to claim 55, wherein
the circuit region that generates the greatest amount of heat per unit area is a logic circuit region.

57. The multi-layered semiconductor apparatus according to claim 55, wherein
circuit regions having longer access times generate a greater amount of heat per unit area.

58. The multi-layered semiconductor apparatus according to claim 55, wherein a drive circuit region that is operable to be driven is provided on the first circuit region or the second circuit region.

59. The multi-layered semiconductor apparatus according to claim 55, further comprising a heat releasing section that releases the heat generated by the circuit regions, wherein the circuit regions are arranged such that there is less thermal resistance between the heat releasing section and circuit regions that generate a greater amount of heat per unit area.

60. The multi-layered semiconductor apparatus according to claim 59, comprising a sealing portion that wraps around the plurality of circuit regions, contacts the heat releasing section, and is formed of a single material, wherein the circuit regions are arranged such that circuit regions that generate a greater amount of heat per unit area are closer to the heat releasing section.

61. The multi-layered semiconductor apparatus according to claim 59, wherein the circuit region that generates the greatest amount of heat per unit area is a logic circuit region.

62. The multi-layered semiconductor apparatus according to claim 59, wherein circuit regions having longer access times generate a greater amount of heat per unit area.

63. The multi-layered semiconductor apparatus according to claim 59, wherein one of the semiconductor chips is connected to a thin circuit board that changes circuit dimensions between the semiconductor chips and an external board.

64. A control method of a multi-layered semiconductor apparatus including a plurality of layered semiconductor chips that each include at least one circuit region, comprising:
controlling timing of driving of the circuit regions, the driving resulting in heat generated by the circuit regions; and
controlling how the heat is spread out based on the timing.

65. The control method of the multi-layered semiconductor apparatus according to claim 64, comprising estimating temperatures of driven circuit regions or heat generated by driven circuit regions to control driving of the circuit regions.

66. The control method of the multi-layered semiconductor apparatus according to claim 65, comprising observing drive cycles or drive times of the circuit regions and estimating the temperatures of the circuit regions or heat generated by the circuit regions based on the drive cycles or the drive times.

67. The control method of the multi-layered semiconductor apparatus according to claim 65, comprising, when the multi-layered semiconductor apparatus includes a plurality of circuit regions having the same function and the amount of generated heat or the temperature of one of the circuit regions having the same function being driven exceeds a threshold value, switching driving to another circuit region having the same function.

68. The control method of the multi-layered semiconductor apparatus according to claim 64, comprising, when the multi-layered semiconductor apparatus includes a heat releasing section that releases heat generated by the circuit regions and a plurality of circuit regions having the same function, from among the circuit regions having the same function, allocating a greater drive time to circuit regions for which there is less thermal resistance between the circuit region and the heat releasing section.

69. The control method of the multi-layered semiconductor apparatus according to claim 64, comprising using at least one of the circuit regions as a dummy circuit region for heat generation.

\* \* \* \* \*